United States Patent
Nydell et al.

(10) Patent No.: US 11,336,126 B2
(45) Date of Patent: May 17, 2022

(54) TRANSMITTER ASSEMBLY FOR FREE SPACE POWER TRANSFER AND DATA COMMUNICATION SYSTEM

(71) Applicant: Phion Technologies Corp., Novato, CA (US)

(72) Inventors: Jonathan Nydell, Novato, CA (US); Steve Laver, Novato, CA (US); Matt Nydell, Novato, CA (US)

(73) Assignee: PHION TECHNOLOGIES CORP., Novato, CA (US)

( * ) Notice: Subject to any disclaimer, the term of this patent is extended or adjusted under 35 U.S.C. 154(b) by 0 days.

(21) Appl. No.: 16/970,099

(22) PCT Filed: Feb. 22, 2019

(86) PCT No.: PCT/US2019/019270
§ 371 (c)(1),
(2) Date: Aug. 14, 2020

(87) PCT Pub. No.: WO2019/165293
PCT Pub. Date: Aug. 29, 2019

(65) Prior Publication Data
US 2021/0119492 A1    Apr. 22, 2021

Related U.S. Application Data

(60) Provisional application No. 62/634,732, filed on Feb. 23, 2018, provisional application No. 62/634,735, filed on Feb. 23, 2018.

(51) Int. Cl.
*H02J 50/80* (2016.01)
*H02J 50/90* (2016.01)
(Continued)

(52) U.S. Cl.
CPC ............ *H02J 50/80* (2016.02); *G02B 19/009* (2013.01); *G02B 19/0028* (2013.01);
(Continued)

(58) Field of Classification Search
None
See application file for complete search history.

(56) References Cited

U.S. PATENT DOCUMENTS

| | | | |
|---|---|---|---|
| 5,229,593 A | 7/1993 | Cato | |
| 6,057,505 A | 5/2000 | Ortabasi | |

(Continued)

FOREIGN PATENT DOCUMENTS

| | | | | |
|---|---|---|---|---|
| CN | 103078678 A | * | 5/2013 | |
| CN | 103078678 A | | 5/2013 | |

(Continued)

OTHER PUBLICATIONS

International Patent Application No. PCT/US2019/019262; Int'l Search Report and the Written Opinion; dated May 14, 2019; 6 pages.

(Continued)

*Primary Examiner* — David W Lambert
(74) *Attorney, Agent, or Firm* — BakerHostetler

(57) ABSTRACT

A transmitter of a wireless power transfer and data communication system comprising a transmitter system including a transmitter housing, one or more high-power laser sources, a laser controller, one or more low-power laser sources, one or more photodiodes, a beam steering system and lens assembly, and a safety system. High-power and low-power beams are directed to corresponding receivers and transceivers of a transceiver system inside a remote receiver system by the controller and the beam steering system and lens assembly. Low-power beams include optical communication to the transceiver system. The photodiodes of the (Continued)

transmitter system receive optical communication from the transceiver system. Low-power beams are co-propagated with and in close proximity to high-power beams substantially along an entire distance between the transmitter housing and the receiver system. The safety system instructs the controller to reduce the high-power sources in response to detected events.

21 Claims, 15 Drawing Sheets

(51) Int. Cl.

| | |
|---|---|
| H02J 50/30 | (2016.01) |
| H02J 7/00 | (2006.01) |
| H04B 10/114 | (2013.01) |
| H04B 10/50 | (2013.01) |
| H04B 10/61 | (2013.01) |
| H01L 31/109 | (2006.01) |
| H02J 7/34 | (2006.01) |
| H04B 10/40 | (2013.01) |
| H01L 31/054 | (2014.01) |
| H02J 50/40 | (2016.01) |
| G02B 19/00 | (2006.01) |
| H01L 31/075 | (2012.01) |
| H04B 10/80 | (2013.01) |
| H01L 31/068 | (2012.01) |
| H01L 31/077 | (2012.01) |
| H04B 10/112 | (2013.01) |
| H01L 31/02 | (2006.01) |
| H01L 31/0224 | (2006.01) |
| H01L 31/0216 | (2014.01) |
| H01L 31/024 | (2014.01) |
| H01L 31/0304 | (2006.01) |
| H01L 31/0475 | (2014.01) |
| H01L 25/16 | (2006.01) |
| H01L 31/052 | (2014.01) |

(52) U.S. Cl.
CPC .... *H01L 31/0224* (2013.01); *H01L 31/02024* (2013.01); *H01L 31/0547* (2014.12); *H01L 31/0682* (2013.01); *H01L 31/075* (2013.01); *H01L 31/077* (2013.01); *H01L 31/109* (2013.01); *H02J 7/00032* (2020.01); *H02J 7/0048* (2020.01); *H02J 7/345* (2013.01); *H02J 50/30* (2016.02); *H02J 50/40* (2016.02); *H02J 50/90* (2016.02); *H04B 10/1123* (2013.01); *H04B 10/1143* (2013.01); *H04B 10/40* (2013.01); *H04B 10/502* (2013.01); *H04B 10/503* (2013.01); *H04B 10/61* (2013.01); *H04B 10/616* (2013.01); *H04B 10/807* (2013.01); *H01L 25/167* (2013.01); *H01L 31/024* (2013.01); *H01L 31/02161* (2013.01); *H01L 31/02167* (2013.01); *H01L 31/022441* (2013.01); *H01L 31/03046* (2013.01); *H01L 31/03048* (2013.01); *H01L 31/0475* (2014.12); *H01L 31/052* (2013.01)

(56) References Cited

U.S. PATENT DOCUMENTS

| | | |
|---|---|---|
| 6,114,834 A | 9/2000 | Parise |
| 6,633,026 B2 | 10/2003 | Tuominen |
| 7,068,991 B2 | 6/2006 | Parise |
| 7,414,193 B1* | 8/2008 | Le .................. H05K 5/0204 174/50 |
| 7,423,767 B2 | 9/2008 | Steinsiek et al. |
| 8,794,229 B2 | 8/2014 | Shi |
| 8,946,939 B2 | 2/2015 | Drennen |
| 9,301,090 B2 | 3/2016 | Kusakari |
| 9,813,151 B2* | 11/2017 | Kingsbury ........... H04B 10/118 |
| 10,097,041 B2 | 10/2018 | Jung et al. |
| 2008/0099871 A1 | 5/2008 | Bui et al. |
| 2009/0175365 A1* | 7/2009 | Jun .................. H04L 27/2608 375/260 |
| 2009/0272424 A1 | 11/2009 | Ortabasi |
| 2010/0012819 A1* | 1/2010 | Graham .................. H02J 5/00 250/205 |
| 2010/0238680 A1* | 9/2010 | Stuart .................. H01S 5/4025 362/553 |
| 2010/0320362 A1* | 12/2010 | Alpert .................. H01S 3/083 250/200 |
| 2012/0043584 A1 | 2/2012 | Joshi et al. |
| 2014/0319641 A1 | 10/2014 | Willmeroth et al. |
| 2015/0091495 A1* | 4/2015 | Mahameed .............. H02J 7/35 320/101 |
| 2015/0357370 A1 | 12/2015 | Yamaguchi |
| 2016/0234778 A1 | 8/2016 | Gaja et al. |
| 2016/0329754 A1 | 11/2016 | Alpert et al. |
| 2017/0077764 A1 | 3/2017 | Bell et al. |
| 2017/0346347 A1 | 11/2017 | Abiri et al. |
| 2018/0212470 A1 | 7/2018 | Leem |
| 2019/0253142 A1 | 8/2019 | Griffith et al. |

FOREIGN PATENT DOCUMENTS

| | | |
|---|---|---|
| WO | WO 2016/154742 A1 | 10/2016 |
| WO | WO 2017/216537 A1 | 12/2017 |

OTHER PUBLICATIONS

International Patent Application No. PCT/US2019/019254; Int'l Search Report and the Written Opinion; dated May 16, 2019; 9 pages.
International Patent Application No. PCT/US2019/019274; Int'l Search Report and the Written Opinion; dated May 15, 2019; 7 pages.
International Patent Application No. PCT/US2019/019282; Int'l Search Report and the Written Opinion; dated May 15, 2019; 11 pages.
International Patent Application No. PCT/US2019/019262; Int'l Preliminary Report on Patentability; dated Sep. 3, 2020; 5 pages.
International Patent Application No. PCT/US2019/019274; Int'l Preliminary Report on Patentability; dated Sep. 3, 2020; 6 pages.
International Patent Application No. PCT/US2019/019270; Int'l Search Report and the Written Opinion; dated May 8, 2019; 10 pages.

* cited by examiner

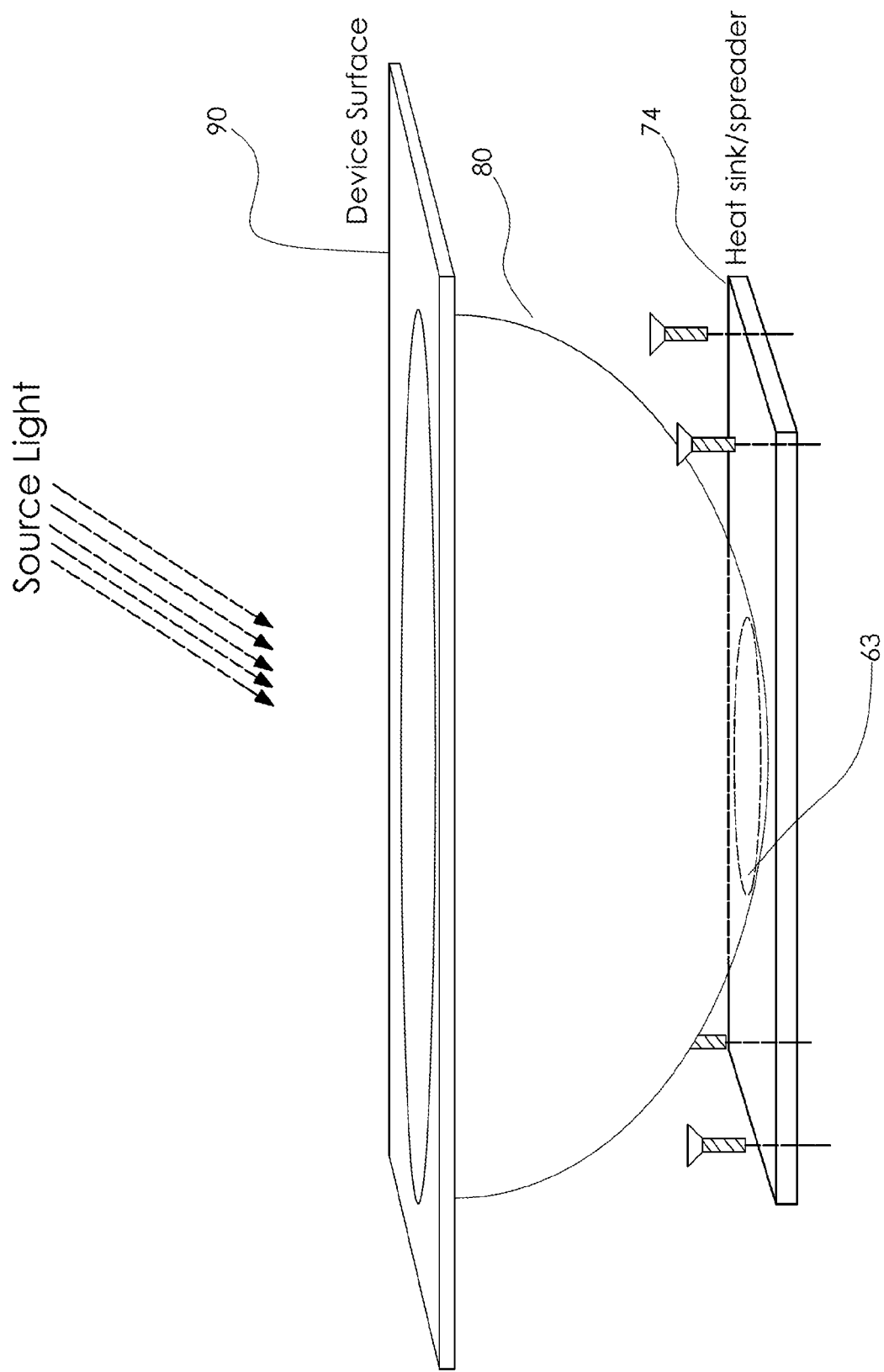

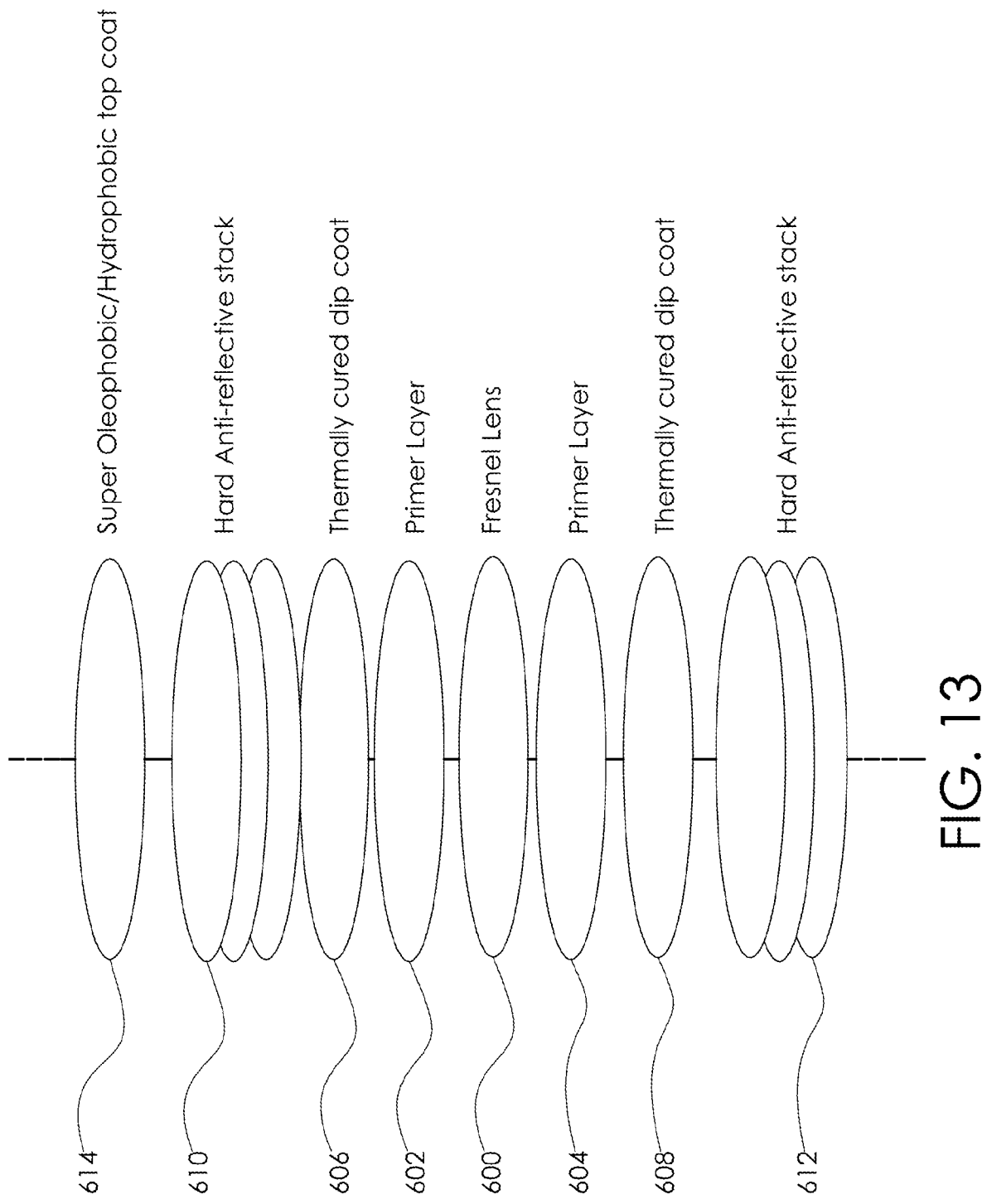

TRANSMITTER ASSEMBLY FOR FREE SPACE POWER TRANSFER AND DATA COMMUNICATION SYSTEM

TECHNICAL FIELD

The present disclosure is related to free space power transfer and data communication systems, and more particularly to transmitter assemblies for the same.

BACKGROUND

Wireless power transfer offers an attractive solution for increasing the mobility of electronic and electromechanical devices, enhancing their usability, and increasing device design freedom, in consumer electronics, industrial, Internet of Things (IoT) and healthcare applications. With regard to consumer electronics, like smart phones, watches and other portable devices, near field wireless power transfer offers an intermediate solution, but falls short of more flexible, useful, and long-term solutions. For near field wireless power transfer, the wireless device to be powered includes a receiver that is generally comprised of metal coils connected to an impedance matching network and rectifier that is used to power a load, such as a battery, and the powering device includes a transmitter that is generally comprised of similar coils to the receiver that are connected to an oscillator and a power source. When the transmitting device is supplied with a time dependent voltage and a corresponding current, the coil current is driven to alternating high and low states in a periodic fashion generating a time dependent magnetic field that couples with the coils of the receiver and allows power to be transferred from the transmitting device to the wireless device. Capacitive coupling between metal electrodes based on high frequency electric fields may similarly be utilized for near field power transfer. In either case, the wireless device needs to be physically close to the transmitting device, and often times precisely aligned, which is a limiting factor to the usefulness of the technology.

Far field wireless power transfer typically relies on power being transferred by beams of electromagnetic radiation, such as radio frequency and laser beams. Limiting factors associated with far field power transfer include directionality, safety, and overall power transfer efficiency. The use of laser beams to transfer power, generally referred to as "power beaming," requires a direct line of sight between a transmitter or source and the receiver or load and raises safety concerns because the laser radiation can cause blindness in humans and animals exposed to low power levels for short time intervals, while high power levels at sustained exposure periods can be deadly.

A number of possible solutions to some of the limitations of power beaming have been developed. In U.S. Pat. No. 6,633,026, for example, one or more light sources are generated around a single power beam forming a virtual insulator. When any one of the surrounding light sources are interrupted, a trigger is generated that causes the power beam to be turned off. This system relies on a receiver that is physically separate from the wireless device and largely stationary as the system, in this patent, lacks the ability to track mobile electronic and electromechanical devices. The system also relies on a two-part process to switch the power beam on, with a first light source searching for receivers needing power at previously known locations and the power beam and virtual insulators then being turned on once the receiver has been located. U.S. Pat. No. 7,068,991 describes a complicated power transfer system, which includes either microwave or laser beams, to both transfer power and provide data communication, but neglects to describe in any technical detail, the process by which power is transferred. As with U.S. Pat. No. 6,633,026, the system described in U.S. Pat. No. 7,068,991 relies on the transmitter sending a preemptive power request signal to the receiver, which results in wasted power when no devices or only fully charged devices are within range of the transmitter.

U.S. Pat. No. 7,423,767 describes a different approach that relies on mechanical beam steering to align the receiver with the incoming power signal, but this introduces a host of shortcomings related to mechanical aspects of the system. Device localization and tracking are not described in sufficient detail for one skilled in the art to implement the invention in a physical system. The patent only describes detecting the receiver based on a reflection from the receiver, which in turn requires locating the center point of a reflective ring and comparing reflected light from each of a number of mapped points. As the transmitter beam approaches the center of the ring reflector, it impinges upon the photovoltaic device from which reflections will decrease significantly. Likewise, as the transmitter beam radially steps away from the center of the ring, it misses the target. The reflections will decrease significantly. There is no explanation on how these two states are differentiated. Likewise, U.S. Published Application No. US2010/0012819 describes a transmitting laser and lens that are attached to a pointing mechanism. The described beam steering solution requires a camera to locate the optical to electrical converter, such as a photodiode, of the receiver with enough precision to direct a beam with <10 mm spot size towards it. In practical terms, this creates a significant size constraint on the optical elements of the wireless device and puts all of the safety responsibility on the transmitter, for which there is no tolerance to faults in the transmitter, whereas safety is handled by both transmitter and receiver in the invention described herein. U.S. Pat. No. 5,229,593 describes a stationary transmitter and receiver that operates at safe levels when the power beam is not being received by the receiver and unsafe level when it is being received. The limitation for mobility of the transmitter and receiver better suits permanent structures or terminals, such as broadcast towers or communication stations, rather than consumer electronics or mobile electromechanical systems.

A critical element of far field power transfer systems is the receiver, and a key aspect of the receiver is the manner in which light energy is transduced into electrical energy. One existing solution to optimizing electrical transduction is to increase the size of the photosensitive region of a photonic sensor. This, however, requires more physical space on the receiver side, which reduces the utility and increases the cost of the device. Photovoltaic cells, such as solar arrays have become much more efficient at converting photons to electrons, but are generally optimized for visible light and require a significant amount of physical space, e.g., the average size of solar panels used in rooftop installations is 65 inches×39 inches with the individual photovoltaic cells measuring 6 inches×6 inches. Integrating spheres, which are hollow volumes having small entrance and exit ports reflect incident light off of internal surfaces into an optoelectronic device that converts the light into energy. Such spheres tend to be less efficient and also require more physical space and thus are generally too large to be useful for mobile devices and many other applications. Thermopiles require less physical space and can operate over large bandwidths, but are inefficient as they convert the light energy to heat, which is then converted to electrical energy. Many sensors that operate in photovoltaic mode implement contact arrangements that obscure incident light on photosensitive regions (by virtue of their electrical connections), thereby yielding lower coupling efficiency. Similar devices are constructed without material composition or geometric arrangement that is specifically designed for single mode light, that can be emitted from a laser.

SUMMARY

A transmitter of a wireless power transfer and data communication system is disclosed. The system comprises a transmitter housing, one or more high-power laser sources, a laser controller, one or more low-power laser sources, one or more photodiodes, a beam steering system and lens assembly, and a safety system. Each high-power laser source may be configured to generate a high-power laser beam to a corresponding high-power receiver inside a receiver housing of a remote receiver system. The laser controller may be configured to individually control operation of each high-power laser source. Each low-power laser source may be configured to generate low-power laser beams to a corresponding low-power light transceiver system in the receiver housing. The low-power laser beams may include first optical communication for the corresponding low-power transceiver system. The photodiodes may be configured to receive second optical communication from each corresponding low-power light transceiver system. The beam steering system and lens assembly may be configured to direct each high-power laser beam to the corresponding high-power light receiver and to direct each low-power laser beam to the corresponding low-power light transceiver system. A first low-power laser beam for a first low-power light transceiver system may be co-propagated with a first high-power laser beam for a first high-power light receiver so that the first low-power laser beam is in close proximity to the first high-power laser beam substantially along an entire distance between the transmitter housing and the receiver housing. The safety system may be configured to instruct the laser controller to reduce the one or more high-power laser sources in response to one or more detected events.

BRIEF DESCRIPTION OF THE DRAWINGS

FIG. 4A is an illustration of a compound parabolic concentrator mirror of the receiver in accordance with an embodiment;

FIG. 13 is an illustration of a lens stack in accordance with an embodiment.

DETAILED DESCRIPTION OF ILLUSTRATIVE EMBODIMENTS

Figure 1:
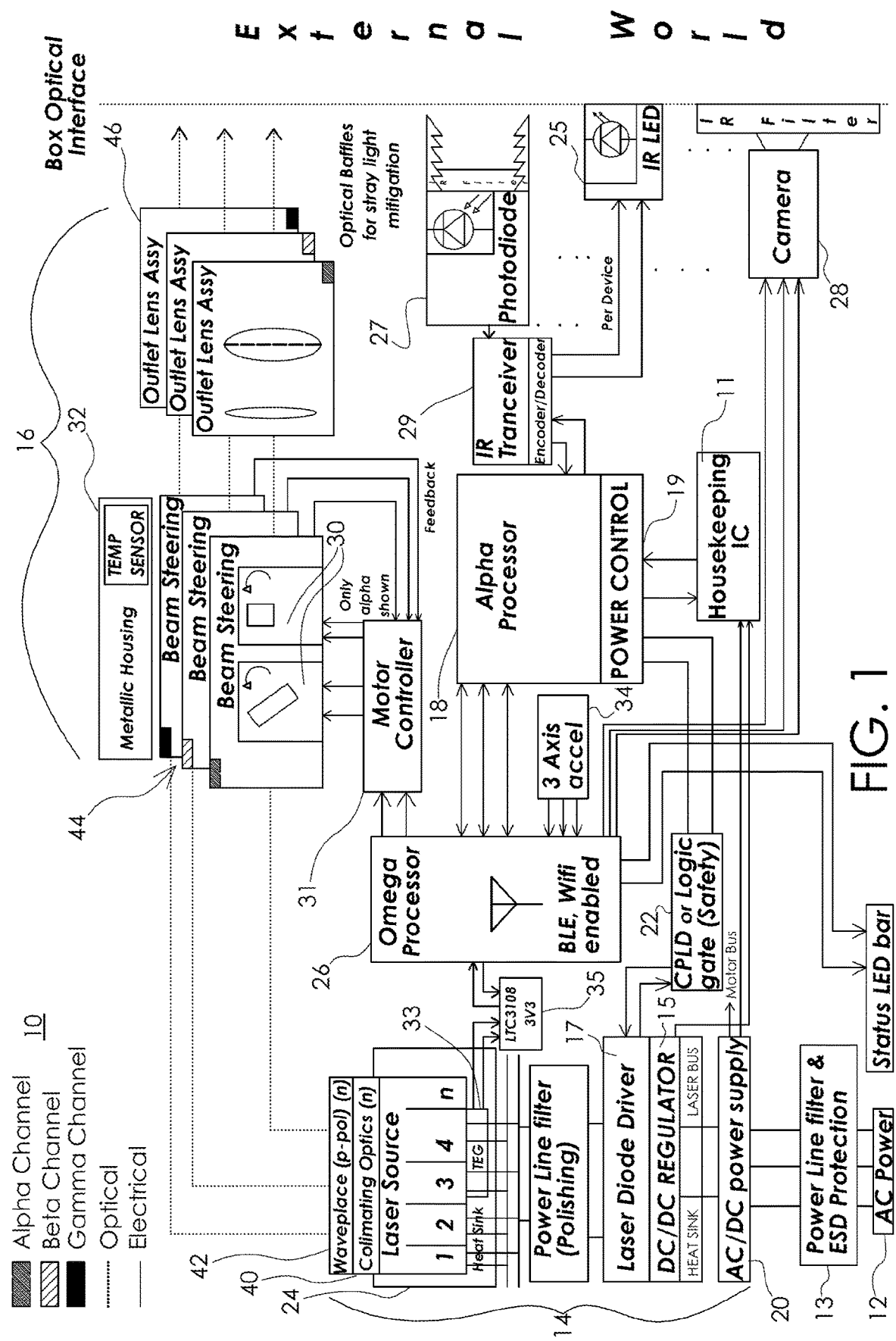
FIG. 1 is a block diagram illustrating a transmitter in accordance with an embodiment.

The wireless power transfer system of the present disclosure may be comprised of two core elements, the transmitter and the receiver, which enable the efficient transmission of power wirelessly from the transmitter to a single receiver or multiple receivers simultaneously, using a collimated infrared laser beam. The transmitter may be stationary, connected to a reliable power source, moderately cost sensitive, and moderately space constrained. The receiver may be mobile, contain a battery or capacitive power source (from which power can be both sourced and sunk, i.e., output and input), cost sensitive, and very space constrained.

From an operational perspective, the transmitter may be responsible for sensing the environment, detecting the presence of suitable receivers, and participating in bidirectional communications with those receivers to determine the precise location of their optical elements. During this initial device localization, a safety system is implemented and then maintained in constant operation during nominal functionality, as further described below. The transmitter may also control the transmission of an infrared (IR) laser power beam and the optics associated with delivering power to the receiver's optical elements in a manner that meets regulatory safety requirements. In order to maintain system safety, the transmitter may strive to cut off the high-power laser beam in as short a time as possible when the safety system detects an interruption, does not receive expected information, the power beam is misaligned, or a receiver's location is lost. The transmitter may also receive, process, store, and forward data about any connected receivers to a centralized digital database.

The receiver may be responsible for broadcasting its presence to the environment and bidirectionally communicating with the transmitter. The transmitter may be responsible for coordinating the priority of wireless power transfer based on a credential exchange with each of a number of potential receivers and may rank the priority of each receiver in order to establish the order in which each receiver is charged. The preference for priority may be established by the user/owner of the wireless power transfer system or be pre-scheduled in the same manner or be left to a state determined by factory settings. The receiver may also cooperate with the transmitter in order to determine the precise localization of the receiver's optical elements. Once the receiver is in or has established communication with the transmitter, it may continuously transfer power and charging state information to the transmitter.

Given specific power and timing limitations involved with the safe wireless transmission of power, the receiver may also communicate device specific information back to the transmitter (i.e., sensor data could be passed over the free space optical communication (FSOC) link to the transmitter, given appropriate overhead in the wireless power transmission). Similarly, the transmitter may communicate commands or data over the FSOC link to the receiver given appropriate overhead in the wireless power transmission. The transmitter may also transmit, via a wireless or wired connection, system or device specific information or diagnostics to a cloud or connected database. Hence, the transmitter and receiver may establish a bi-directional data communication channel enabling the transfer of data unrelated to the power operation or location of the device itself. Various IoT or other similar devices could both receive power and other data and/or commands through the wireless power transfer system. For example, a smart thermostat could send room temperature information to the wireless power transfer system, which could then transfer that temperature information to an HVAC controller or an automated window shade that is also powered through the wireless power transfer system.

An illustration of the transmitter in accordance with one embodiment is shown in FIG. 1. As illustrated, the transmitter 10 may include a power source 12, a laser system 14 for generating one or more power beams and one or more light beams, optomechanics 16 for beam steering, a processor 18 and associated power control logic 19 for controlling the laser system 14 and optomechanics 16, as well as a communication subsystem and safety subsystem. The transmitter 10 may perform all of the major compute processes required to keep the system accurate and safe. At the logic level, the processor 18, such as an ARM Cortex processor, may provide high-level control over the majority of functions for which the transmitter is responsible. The processor may contain command sets specific to various transmitter functions such as beam steering, power beam output control, FSOC data processing, thermal control, sensor data transfer, sensor fusion, and system reporting. An additional housekeeping integrated circuit (IC) 11 may be utilized to provide over and under current protection/monitoring of the DC to DC converter/regulator 15 and overall fault management, reporting and clearing. This may be particularly useful when the wireless power transfer system is utilized medical, aerospace and other higher risk environments when there is a greater need to maintain a safe state of the system regardless of various faults that may occur, thereby creating a fault-tolerant system that is generally required by governmental regulations for devices used in these applications.

Power for the transmitter 10 is derived in this embodiment from a stable power source 12 coupled to a laser AC/DC power supply 20 through a power line filter and ESD protection circuitry 13. The power source 12 may come in many forms, such as a high voltage battery, a wall outlet or other secondary power generator off the main power grid. The input signal may be AC from 120Vac to 240Vac and may be plugged into a standard wall outlet (15A/20A for North America, 16A+ for EU) or a standard DC voltage at an amplitude commensurate with system requirements. The input power 12 may pass through the power supply 20 that may include a 2-stage converter that converts the AC voltage to DC voltage, that is unregulated or regulated, and then a DC to DC converter/regulator 15 to regulate the output into a plurality of voltages. From there, the voltage may be down converted as necessary to supply various sub circuits.

In this embodiment, three power busses may be included, such as a laser bus for biasing laser components, a logic bus for biasing processing and compute components, and a motor bus for biasing electromechanical loads or subsystems. Each subsystem of the transmitter 10 may derive power from one of these three busses. To isolate noise, the power busses may be decoupled from one another via passive components, split grounds, or on-board shielding (e.g., egg crating). The logic bus may be provided through the complex programmable logic device (CPLD) 22. As those skilled in the art may realize, different bus and/or power distribution methods may be used depending on the components and converters used.

The power supply 20 for the laser diode of the laser system 14 may be a highly regulated (stabilized) current supply that operates in current control mode. The supplied current may be monitored against a current set point to generate an error value. That error value may be fed back into the power supply logic and/or controller/laser diode driver 17 to fine tune the output. The power supply 20 and/or laser diode driver 17 coupled to the power supply 20 may also incorporate a command input associated with an output from the CPLD 22 of the safety system, which may serve to disable the power supply 20 and/or the laser diode driver 17 should an obstacle in either partial or full obstruction the path of the light beams be detected or for other safety reasons. In order to shut off the power or driver quickly, the bandwidth of the power supply may be greater than 5 kHz. The laser source 24 may be, but not limited to, a laser diode on a C-Mount/TO-Can/integrated module package and may be fixed in place. So that the transmitter can accommodate multiple receivers, a number (n) of identical laser diode sources 24 may be fed from the same power supply 20 or by separate power supplies for each laser diode. A heat sink with or without an active cooling device may be included to temperature regulate the power supply, regulator and driver components.

In an embodiment, the output of the laser source 24 may be split by beam splitters, optical filters, or mirrors into two or more separate beam paths. The resulting beams may be used in separate power beam channels to supply two or more devices from a single source. In an embodiment in which a single source may supply multiple receivers, a series of active optics may be used to decrease optical output power for a single channel in the event that one receiver is blocked and the other is not, thereby eliminating the need to turn off the single laser source to both devices in the event that a block occurs with one device.

In addition to the power beams being identically fed from the laser bus, a different, lower power beam may also be supplied by one or more FSOC lasers. The FSOC channels may be established with a single or multiple light emitting diodes (LEDs) or low power laser diodes to transmit optical data and single or multiple photodiodes to receive optical data. FSOC components may be configured to operate off either the laser or logic bus depending on subsystem voltage requirements and efficiencies. The transmitter and receiver may be made modular by implementing identical FSOC components, wherein the transmit device from the transmitter communicates with the receive device in the receiver identically to the transmit device in the receiver to the receive device in the transmitter.

The logic bus may provide a reference voltage for all of the components controlling logic functions. This may include the CPLD (safety) 22 (such as XILINX or Intel CPLDs, the processor 18 (such as Intel and Freescale), the microcontroller unit (MCU) 26 (such as an ARM Cortex or similar products by XILINX, or NVIDIA), a camera 28, auxiliary sensors or secondary power regenerators, and finally any active optical applications needed for future device capabilities (such as variable beam splitters/attenuators, polarization plates, etc.).

The motor bus may be responsible for supplying appropriate voltage to the two-axis beam steering brushless DC (BLDC) motors 30 as the principle optomechanical components 16. Two-axis motors 30 may include reflective or refractive optics and be employed to enable the projected light to provide a wide cone of coverage extending from the optical interface of the transmitter housing 32 (as further illustrated in FIG. 2) to the walls and/or floors of the room or location in which it is staged. Control of the motors 30, augmented by a feedback loop, is provided by a motor controller 31, which is a logic driven component of the MCU processor 26. Alternative methods for beam steering, such as MEMS mirrors, gimbal assemblies, Risley prisms, liquid crystal waveguides, optical phased arrays, or other solid-state beam steering assemblies may be used that are familiar to those skilled in the art and are not precluded from this disclosure.

As noted above, the processor 18 provides most of the logic control of the transmitter, including partial FSOC photodiode 27 and camera 28 monitoring, FSOC LED 25 command, and beam steering logic command of the optomechanical system 16. Communicative coupling between the FSOC LED 25 and FSOC photodiode 27 may be provided by IR transceiver 29, which is coupled to the processor 18, and includes an encoder/decoder. The separate MCU processor 26 may feed auxiliary input to the optomechanical system 16 to better assist with beam steering accuracy and thermal requirements, including but not limited to: command of a fan or a thermal electric generator (TEG) 33 or cooler based on thermal readings from a thermocouple or temperature sensors (not shown), fine beam steering adjustments based on accelerometer 34 feedback, position or configuration modification based on requirements for potential future active optics (not shown). Power management of the TEG 33 may be provided by step-up transformer 35.

Closed loop control of the FSOC LED 25, assisted with direct receiver distance detection, may be provided via a computer vision-based algorithm that determines the needed strength of the FSOC LED transmit signal based on the pre-calibrated lighting conditions of the room or location as detected by camera 28 and processed by processor 18. In other words, if the disclosed wireless power transfer system is utilized in a room or location with significant ambient or shifting natural light, it may be desirable to utilize pictures taken by the camera 28 to adjust, i.e., increase, the output power of the FSOC LED 25. If the lighting in the room or location was below the pre-calibrated lighting conditions, then the output power of the FSOC LED 25 may be decreased. By adjusting the amount of output power needed based on feedback lighting conditions of the operational environment, transmission efficiencies may be realized.

The CPLD 22, which may be a separate IC or which may have its functionality integrated into a more complex IC, or a dedicated safety/control component, may be responsible for the overall command and control of the safety subsystem. This may include shutdown commands to the laser diode power supply 20, the processing of optical power levels from a monitor photodiode or optoelectronic sensor (not shown), the generation of any error or fault messages to the processor 18, and any other actions associated with maintaining user safety as a result of impingement of the high-powered laser beam. The CPLD 22 may require the presence of two signals from: 1) the additional processor 26 and 2) the main processor 18 in order to enable the laser source 24 to reach optimal power beaming levels. Additional electrical components (mostly not shown) may include passive devices responsible for filtering, grounding, shielding and the like, converting power, transmitting telemetry over WiFi, Bluetooth, or dedicated RF link, sensors required for initial calibration, additional indicator LED or screens provided for the benefit of the user but not required for system functionality, etc.

The optical and optomechanical components of the transmitter 10 may shape and control laser beam properties in two axes. A first set of collimating optics 40 are positioned off the edge facet of the laser diode 24. The collimating optics 40 may be a molded set of n lenses responsible for producing a beam parallel in two axes for injection into the beam steering assembly. The collimating optics 40 may include a Fast Axis Collimator (FAC) and a slow axis lens to shape the beam(s) in two dimensions. The FAC may be comprised of an aspheric cylinder of appropriate diameter and thickness, a ball lens, a small section of fiber optic cable, or a plurality of optics used in conjunction or independently. A small truncated section of appropriate fiber optic cable may be used as a cheap and quick lens for fast axis collimation. In one embodiment, a section of fiber optic cable, slightly longer than the longer dimension of the laser facet may be secured by mechanical means to the front face of this facet such that the long axis is parallel and adjacent to the long axis of the facet. The fiber optic cable will act in a similar manner to an aspheric cylindrical lens by parallelizing all divergent rays from the laser or slight source. This method may provide a quicker way to achieve collimation than use of delicate and often expensive fast axis lenses.

The laser diode 24 may be uniquely designed to produce light with a single polarization by uniquely shaping or growing the laser cavity region. Since reflections off the receiver surface are a concern for any high-power free space optical system, ensuring that the generated light is p polarized may help to reduce reflections, even past 60 degrees beam angle of incidence. This may be achieved through the addition of the p-polarized waveplate 42 that is placed over a corresponding collimating optics 40 (i.e., there may be n waveplates 42, which corresponds to a collimating optics 40 and a laser source 24). A spatial filter with V-coating may also be added to ensure uniform profile of the output beam(s).

In an embodiment, the remaining optics may be part of the optomechanics 16. The optomechanics 16 may include a beam steering assembly 44 having a 2-axis galvanometer mirrors that is driven by rotary BLDC motors 30. The galvanometer motor control is coordinated by the MCU 18, with command to the motors 30 based on interpreted feedback from the FSOC photodiode 27. The structure of the optomechanics 16 is modular, meaning the optomechanic 16 structure may be substituted in and out of different packages and therefore can be used in a plurality of devices, housings and enclosures. The mirrors of the optomechanics 16 may be thin film, multi-layer silver and or gold coated for best response in the IR wavelength range and environmental survivability. The mirrors may rotate depending on motor 30 position, deflecting the beam toward the receiver. A final set of output optics, outlet lens assembly 46 may be included to actively focus the power beam. Limiting beaming distances for this system in a range of up to 50 feet may eliminate the need for dynamic focusing, but the current disclosure is not limited to this particularly distance and may be used for longer free space optical applications. Long-wave pass filters (not shown) may also be used on potential lenses in front of FSOC optoelectronics, including IR camera 28, FSOC photodiode 27 and FSOC LED 25. Ideally, these filter additions are not necessary, but are noted here for completeness.

Figure 2:
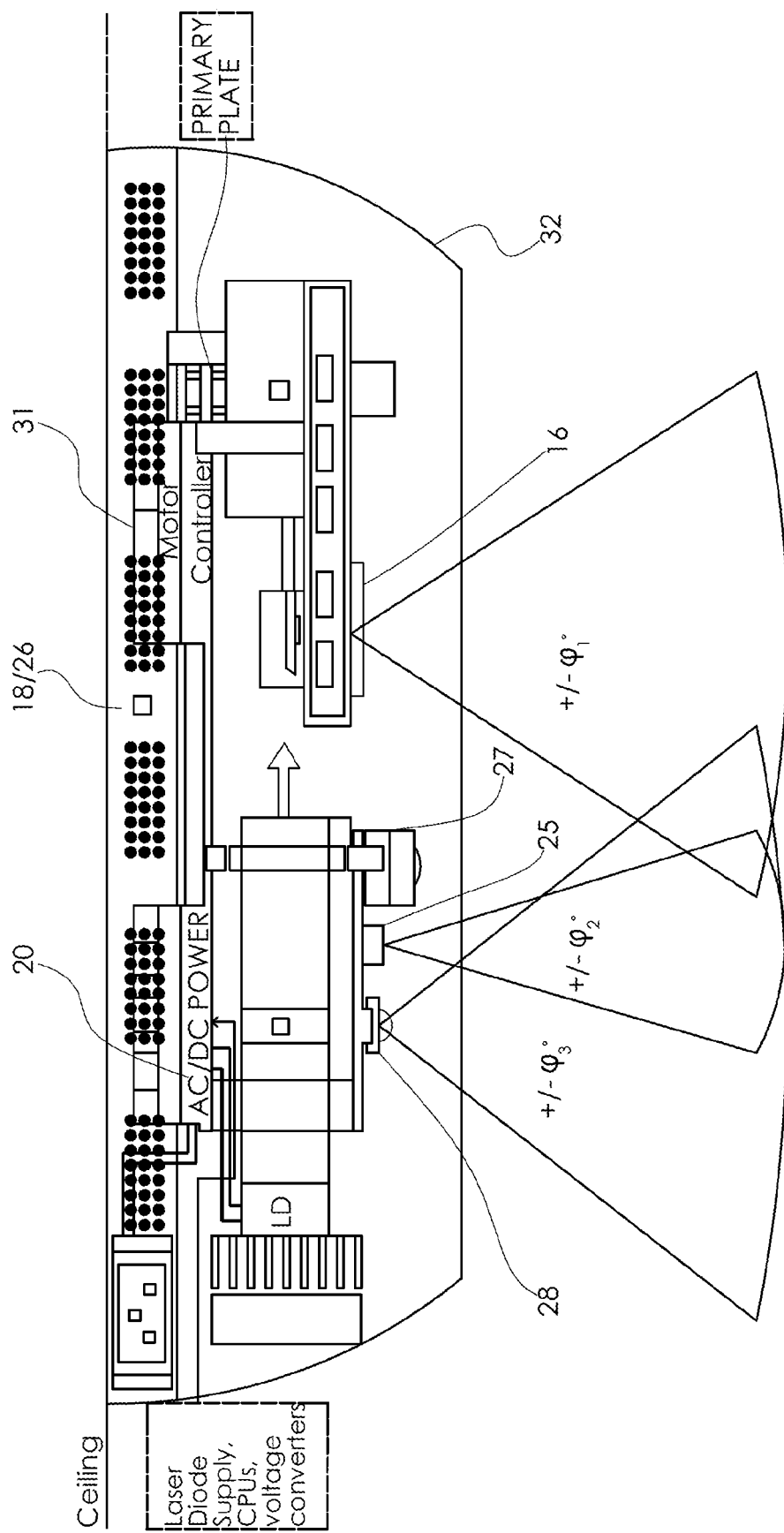
FIG. 2 is an illustration of a transmitter enclosure in accordance with an embodiment.

The transmitter enclosure 32, which is further illustrated in FIG. 2, may be a standalone structure or incorporated into other devices, such as but not limited to: light fixtures, smoke detectors, security cameras, drones, and other mobile or static systems, depending on the nature and location of its use. The physical structure 32 may house all of the components of the transmitter 10. The mechanical structure may be designed to satisfy the performance and environmental requirements of a wireless power beaming system. The structure may incorporate mechanical features and specific materials to increase conventional convective and radiative thermal dissipation for the power beaming laser diode 24 and/or other high current loads. Mechanical isolators may be utilized to stabilize the system from inherent vibrational resonance associated with human movement across rooms of various constructions as well as mechanical system influences, such as HVAC systems and the like. In an embodiment, the portion of the enclosure 32 where any optical beam passes may be made of a material that is opaque at visible wavelengths and transparent in the near infrared wavelength range. The entire enclosure 32 may also be made of this material. In that manner, a user will only see an enclosure, like the outside of a fire detector on a ceiling, and not the active/internal components. The materials and overall mechanical structure may allow it to be used in a plurality of environments.

As the power beam is transmitted in a form that can be dangerous to humans and animals, safety aspects of the system are of critical importance. Embodiments of the present disclosure therefore include a built-in safety system to prevent human, animal and obstacle exposure to laser radiation in excess of eye safe levels, which trigger the most restrictive levels of safety regulation. In accordance with the present disclosure, the system is inherently safe, which is defined as follows with reference to the architecture of the system. A bidirectional low power laser beam, or FSOC channel, is established between a transmitter and one or more remote receivers, one or both of which may be mobile. The channel laser power is below Maximum Permissible Exposure (MPE) limits and is therefore classified as eye safe and can therefore be operational at all times without fear of adverse effects on intersecting objects. The channel substantially co-propagates with the high-power laser beam such that they are not more than 1-10 mm apart for substantially an entire distance from the optical interface of the transmitter to the receiver. Due to their close proximity, the low power laser beam is interrupted before the high-power laser beam can be interrupted and interruption of the low power laser beam results in the high-power beam laser being shut down. As is known, laser radiation can be used for communication when there is a well-established Line of Sight (LOS) between the transmitter and receiver. In one embodiment, in the event that this LOS is broken for any number of obstacles or situations, the high-powered laser is designed to terminate within the time requirement allowable for observance of maximum permissible exposure (MPE) limits congruent with Accessible Emissions Limits (AEL). For Class I, eye safe classification, AEL is equivalent to MPE. Because LOS is built into the safety features and overall functionality of the system, one cannot exist without the other; hence, the system can be classified as "inherently safe."

In one embodiment, the hardware and software implementations of the safety system may consist of a transmitting source, usually one connected to a reliable and stable power source, and a mobile or peripheral receiver, containing minimal electrical parts and implementing basic Digital Signal Processing (DSP), and coupled with the host device in which it is integrated. This embodiment of the safety system may be designed explicitly for high power laser beaming in the Near IR (NIR) wavelength regime. The timing of the system may be easily adjusted to accommodate scaling safety requirements associated with visible or even UV light. The premise of the system in this embodiment may rely on fast and accurate detection of obstacles within the beam path that couple dependency of system latency with maximum permissible exposure (MPE) levels. As further described below, additional embodiments of the safety system include hardware and software implementations that will shut the high-power laser beam down for other reasons.

For background purposes, the current governing standard for laser safety and laser safety certification of consumer sold products are 21 Code of Federal Regulations (CFR) Part 1040 entitled "Performance standards for light emitting products in the United States," and IEC60825-1, the latter of which regulates the safety of laser products in Europe and the rest of the world. In 2007, the FDA issued Laser Notice 50 that describes the conditions under which equipment manufacturers may introduce into U.S. commerce laser products that comply with the IEC60825-1 standard. This document effectively harmonized the certification standards for Europe and the U.S. to provide a "least burdensome approach." Laser Notice 50, with reference to IEC60825-1, established all system latency and detection mechanisms responsible for beam operational safety. The popular ANSI Z136.1 documentation also provides a guideline for classifying such lasers and safety/control measures associated with their safe operation, but does not apply as a certification standard against which products seeking said certification should be compared. Naturally, these standards are subject to change.

In typical certification governance, laser products are discretized into classes by virtue of their output characteristics. Depending on pulsed or continuous wave (constant or CW) output either a Watt or Joule (Watt seconds) limit level is, generally, applied. Accessible emissions limits or (AEL) are determined as a product of the MPE multiplied by an area factor, referred to as the limiting aperture.

With regard to the present disclosure, operation of the laser source may be CW or pulsed. In CW operation, the average power delivery is often far higher than that of a pulsed system. Although a CW system is described below for ease of disclosure, a pulsed system of various pulse lengths could also, be used. This configuration may also be implemented for a receiver device (with a lower power rating) in operation with a transmitter, without dynamic power control. In an embodiment, a transmitter device emits a high-powered CW light. At the same time, either co-propagated and in parallel with the high-power beam, a neighboring low power laser beam may also be emitted from a different electrical to optical component, but positioned within millimeter proximity to the high-powered source. The lower power laser beam may have far greater divergence than the high-power beam and thus diverge over a shorter distance that the high-power beam. For purposes of the present disclosure, the operational or working distance of this system may be within the range of 1 foot to 30+ feet. This operational distance enables the lower power photodiode assembly of the receiver to have greater tolerance on placement, but higher requirement on sensitivity. The co-propagated low power laser beam thereby creates a virtual enclosure around the higher power beam over the operational distance. If the system is used over distances such as those specified above, atmospheric absorption and scattering may not cause an issue.

In order to increase usefulness and capability of the system, a digital data stream may be modulated onto the low power laser beam. Modulation schemes come in various forms and complexities. In order to create efficient systems, there may be a large reliance on low overhead power consumption, or in other words keeping the power used by all other parts of the safety system as low as possible. The modulation scheme is therefore carefully chosen to balance:

1. Power consumption overheard, which includes processing, data storage, A/D or D/A conversion, and transmission;
2. Serial data rate, which is the rate at which the system can adequately communicate receiver information and the transmitter can interpret said information in order to follow an appropriate action/command;
3. Part count/type, i.e., decreasing the part count, especially on the mobile receiver side, decreases the footprint and space needed for implementation of such subsystems.
4. Multiple access, or the ability to accommodate multiple mobile receivers with a single transmitter.

The transmitter/receiver system may have coupled modulation/demodulation architectures that associate unique frequencies, timing, or signal qualities to coupled devices. In this embodiment, it is possible to support numerous receiver devices with a single transmitter differentiated by their serial data rate, pulse amplitude, or timing of transmission. This may be similar to how the NTIA Office of Spectrum Management or FCC manages spectrum usage, i.e., the transmitter manages device wavelength usage. OFDM, OCDMA, or M-PPM are also acceptable modulation methods and are not excluded from the present disclosure.

In its simplest form, modulating the low power laser beam by turning it on and off (On/Off Keying—OOK) can be used to convey a series of bits, or a bit sequence and is considered a common communication protocol in Intensity Modulated/Direct Detection (IM/DD) schemes. A bit sequence library known to both the transmitter and coupled receiver provide meaning to the alternating bit sequences. OOK keeps processing overhead requirements low and increases the effective bandwidth of the system, which increases the speed of signaling and therefore decreases latency (up to the point where processing bottlenecks are due to the hardware/chip speeds). OOK is one such modulation scheme that may be used as full or partial satisfaction of communication and safety requirements. It should be apparent to those skilled in the art that other modulation schemes can be effectively used to achieve similar purposes.

The MPE/AEL levels may be designed such that the shorter the exposure the higher the allowed optical power to meet the same energy exposure levels for pulsed operation. In essence, obstacle exposure to the beam may be considered a pulsed exposure, even though the system is operating with a CW output, considering the cut-off time achievable by the transmitter. At the upper wavelength range of the IR-A and all of the IR-B wavelengths, the radiation is generally considered eye safe due to the long wavelength, i.e., the eye does not focus the radiation to the retina nor does the radiation penetrate to lower levels of the epidermis. Cornea exposure to laser radiation is hazardous for spot heating and the same is true with other soft tissue at these wavelengths. Spot heating requires the application of a high-power laser source of significant power across a small surface area for a specified duration of time. Thus, hazardous conditions for this system are temporal. Some embodiments of the present disclosure seek to satisfy such timing requirements.

If the disclosed system is deployed in environments that are considered uncontrolled, one in which occupants are nominally unaware of exposure to laser radiation, safety is a requirement for lasers above the class 1 level. In such situations, laser radiation hazards are dependent on the time of exposure, the radiation power level, and the wavelength of laser radiation. In an embodiment, the power beam laser wavelength may be chosen based on a number of factors. One such factor may be the wavelength range in which radiation is least hazardous to unaware users. In such instances, the wavelengths of the laser that are not focused to the retina have higher exposure limits and are therefore preferable for the embodiment.

The transmitter architecture, in effect, acts as a watchdog for the receiver circuit. If a predetermined time period passes during which the transmitter does not receive data from the receiver or a lack of bits are counted from the receiver or a specific bit sequence is transmitted from the receiver, the transmitter associates this absence/bit sequence with a specific message and shuts the laser diode off or decreases the output to Class 1 levels. By providing constant feedback between the receiver and the transmitter, the system is functionally capable of safety, as well as receiver tracking. In addition to the receiver feedback data, a number of different voltage and/or current levels within the transmitter may be monitored, for a myriad of purposes, including but not limited to:

1. [Transmitter] Prior to laser diode—voltage and current
2. [Receiver] Downstream of the photodiode assembly—voltage and current
3. [Receiver] Downstream of the DC/DC converter—voltage only
4. [Transmitter] Downstream of the FSOC photodiode—voltage only These measurements may produce all the information needed to make decisions about safety of the system in any situation. The receiver is constantly updating its state to the transmitter. Interruption of that state update or mismatch to ideal parameters for power reception result in a decrease in high power laser beam power. The beam cut off timing requirements for the system may be dependent on the output power and beam spot of the laser diode. It is therefore possible to assign cut-off times dynamically between the transmitter and receiver if necessary.

In its full implementation, the present disclosure may offer fault detection and, in some instances, fault tolerance. For all critical safety features, there may be one or more fault tolerances built into the hardware and software. The safety critical hardware may be solely contained on the transmitter side of the system as the hazardous condition is only created by the transmitter, namely the high-power laser beam. This critical hardware may include the optoelectronic sensor, the operational amplifier, the processors implementable in various forms, and the laser diode power supply.

Some fault tolerance conditions may include:
1. A single fault, whether through an electrical short or open circuit of the optoelectronic sensor. Such a fault would cause a voltage output of zero, in the short case or float, in the open circuit case. In ether fault condition, the processor would recognize a repeated bit sequence over several clock cycles that would automatically trigger beam shut down.

2. A single fault to either the processor or the laser power supply resulting in an electrical short or open circuit. In the open circuit case, there would be no current feeding the power supply circuit and thus there would be no possible mechanism for energizing the laser diode. In the short circuit case, the processors would have the capability of running a check of the aforementioned monitored laser diode current against the trigger state of the processors to laser supply switch. The current reading would be interpreted as a 1 or 0 representing current present in the circuit or absent, respectively. That binary output may be compared against the trigger state of the processor via an OR operation. This comparison may output a signal to cease supply to the laser diode in an unsafe circumstance.

3. An additional software check on the fault state that requires multiple assigned and expected signals to be present before initiating the high-power supply for the laser. Any absence or off-nominal values of these specific signals would result in the laser diode remaining off.

In one embodiment, the safety optoelectronic components may be designed specifically for detection in the IR wavelengths, but distinct from the high-power laser wavelength. The use of photodiode/LED pairs matched to the same operational wavelength allows for communication over nearly 180-degree full angle field of view (FOV) without the need of additional focusing or conditioning optics.

The method of operation and implementation of the safety system described herein equally allows for communication of system state data to any remote processor determinable via a User Interface (UI), which may be further used to fix potential connection issues by manually removing an obstacle or interruption. In this embodiment, a lack of signal for a specific bit count (time period) may lead to a UI message being sent informing the user of the current fault. The message type is interpreted from the data received from the low power laser beam, FSOC link. Although greatly simplified for the use of a FSO signal, the internal electrical modulation or messaging can be far more complex without taxing the processor. This may improve the uptime, overall functional efficiency and usability of the system.

Figure 3:
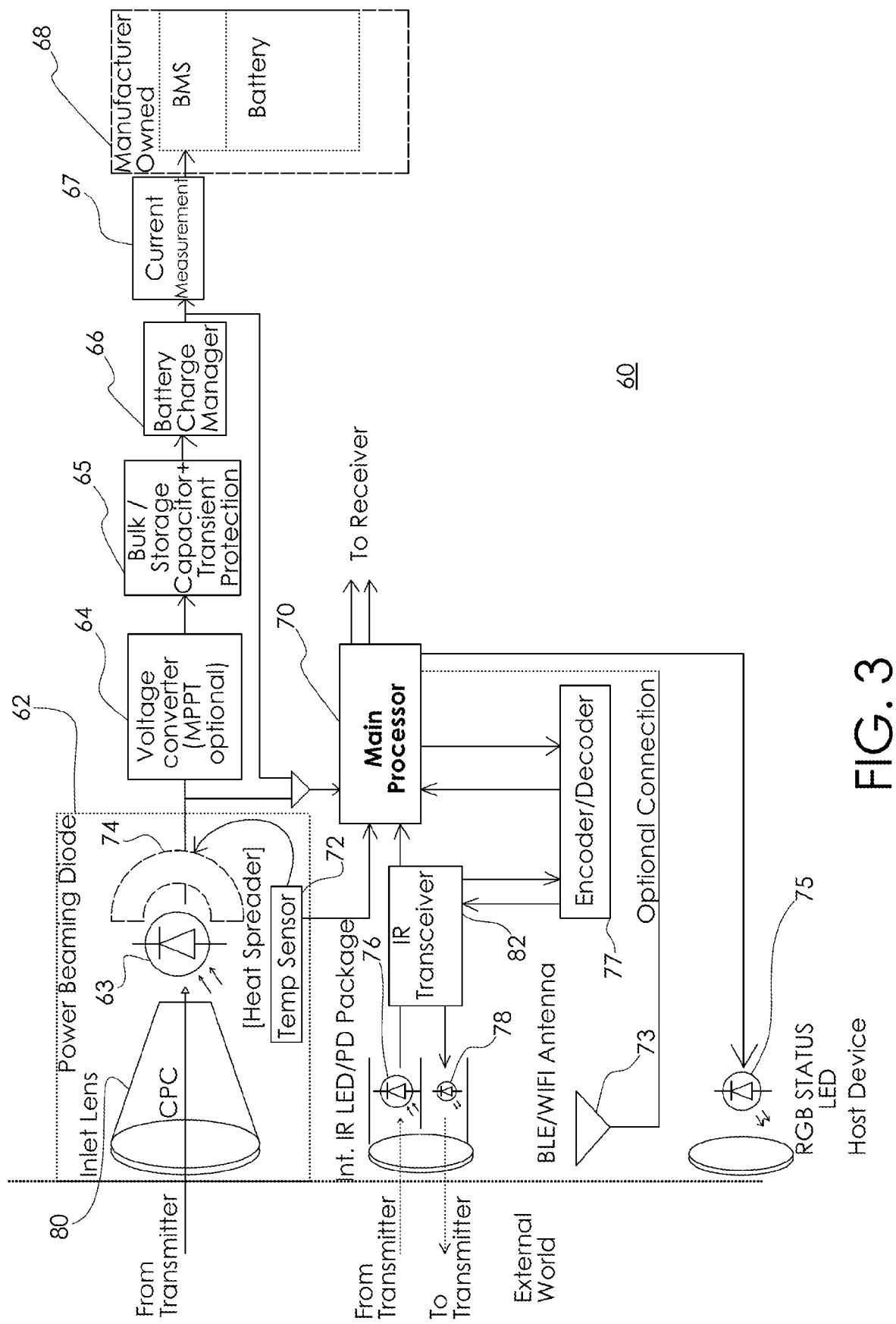
FIG. 3 is a block diagram illustrating a receiver in accordance with an embodiment.

Turning now to the receiver, which is first illustrated in FIG. 3 as part of a receiver or host structure, i.e., the device in which the receiver 60 is installed, the receiver 60 is comprised of a photodiode assembly 62 including a photodiode array 63. The photodiode array 63, or diode, is not limited to diode-based technology and may be implemented with alternative technologies, now existing or developed in the future, capable of performing similarly. Nor is the photodiode assembly 62 limited to wireless power transfer embodiments. The photodiode assembly of the current disclosure may be readily adapted to a variety of other embodiments where the efficient transfer of light into current and voltage is desired, in applications requiring precise alignment, in applications involving optical signals in extreme environments, or similar embodiments.

In an embodiment, the photodiode assembly 63 may be capable of high optical to electrical power transduction and associated power electronics that are responsible for receiving the electrical power in the form of current and voltage and appropriately converting the voltage via an electrical voltage converter 64, such as a boost converter, that voltage and current into a usable voltage and current for battery charging, a battery charger manager 66 for controlling the flow of current and bias voltage applied to the rechargeable storage device or battery 68, and a low power processor/controller 70. The processor controller may sample voltage and current outputs from both the photodiode assembly 62 and battery charge manager 66, encode and modulate/demodulate digital and analog signals to and from a remote transmitter unit, push user information from local buffers to transmitted RF connections (which may be in the form of Bluetooth, WiFi or similar), and monitor the temperature of the photodiode assembly's heat sink via a temperature sensor 72 and communicate that state to a remote transmitter via antenna 73 or low power laser beam.

In order to increase the usability of systems deployed in what may be chaotic and unpredictable user environments, one or more visual UI indicators, such as RGB status LED 75, may be added. In an embodiment, the primary UI 75 displays a visual indicator with different or similar states, but not identical states. Each of the states represents, in a simple sense, the overall state of either the receiver, the transmitter, or both. The plurality of state representations through such visual indicators will allow the user to interact more efficiently with the system. In an embodiment, a small circle with a dot in the middle represents the visual indicator and one state. A small circle with the dot blinking represents a second state. A circle without the dot represents a third state. A circle blinking represents a fourth state. Different colors may be used for the circle and dot in different combinations to represent additional states. In these aforementioned chaotic environments, the visual indicator will provide cues for user knowledge. In one such implementation, a second state may mean there is partial or full block in the LOS between the transmitter and receiver and thus action should be taken to correct this state, such as move the device or move the obstruction. A first state may represent that the device is engaged in wireless power transfer, a third state may represent the transmitter is trying to find the receiver, and a fourth state may indicate that the transmitter and receiver are not synced.

Further receiver 60 elements include: heat sink/spreader elements 74 that may control thermal properties of the photodiode assembly when subjected to the high power laser beam; an IR communication photodiode 76 collocated with the photodiode assembly 63; an IR LED 78 collocated with the photodiode assembly 63, a compound parabolic concentrator (CPC) mirror element 80; an antireflective (AR) coated, scratch resistant window surface (not shown) at the collector inlet over the mirror element 80; a Li Ion or Li Polymer battery housing (not shown) for modular attachment of the battery 68 or the incorporation of a receiver rechargeable unit; and a device enclosure (not shown) to package and/or contain the above elements. In an embodiment, the receiver devices may be integrated into a larger device used in the consumer electronics, medical, or industrial industries.

The photodiode assembly 63 may capture and convert a high-power optical beam into electrical power in the form of current and voltage. The power electronics may use the output voltage and current from the photodiode assembly and convert it through the voltage converter 64 to a voltage applicable for battery charging, depending on the battery or rechargeable load impedance. In some embodiments, the voltage converter 64 may not be necessary as the raw output of the photodiode assembly 63 may fit within the operational voltage and current of the connected energy storage device 65. The power electronics may also track the input impedance of the photodiode assembly 63 and control the voltage and current based on this device impedance in the form of Maximum Power Point Tracking (MPPT). The battery charger manager 66 circuit may be responsible for controlling current and voltage into the rechargeable storage device 68 based on optimal charge cycle per rechargeable storage device configuration. Current and/or voltage output by the battery charge manager 66 may be measured by current/voltage measurement 67 The output from the photodiode assembly may also be used to temporarily power other active elements of the receiver system.

The processor or controller 70, such as an ARM Cortex or similar processor, may collect data from the photodiode assembly 63 and the voltage converter 64 output voltage information and encode that information, via encoder/decoder 77, onto a carrier wave via modulation processes through an IR transmitter 82. The voltage feedback information may provide interpretation of transmitter beam landing accuracy and any emergency or hazard detection signals. The processor 70 may also be responsible for demodulation of any transmitter-generated signals that are received, decoding that information, and processing and performing any suggested action resulting from that information. The processor 70 may further store information in a local buffer (not shown) for subsequent push to a Bluetooth, WiFi, or other RF connection, such as information and statistics on system efficiency and system health for forwarding to remote storage locations based on the required timing for needed specific information.

IR photodiode 76 converts an incoming IR low power laser beam signal into electrical pulses that are amplified and sent to the processors or controller 70. The IR LED 78 converts electrical pulses to optical signals for transmission outside of the receiver's mechanical structure in a wide FOV. Optomechanical enclosures (not shown), such as window elements in connection with the inlet of the CPC device 80 and over the photodiode assembly 62 may seal off sensitive optoelectronic surfaces, ensure a continuous outer mold line (OML) of the receiver/structure, and ensure favorable optical paths for incoming and outgoing light.

Figure 12:
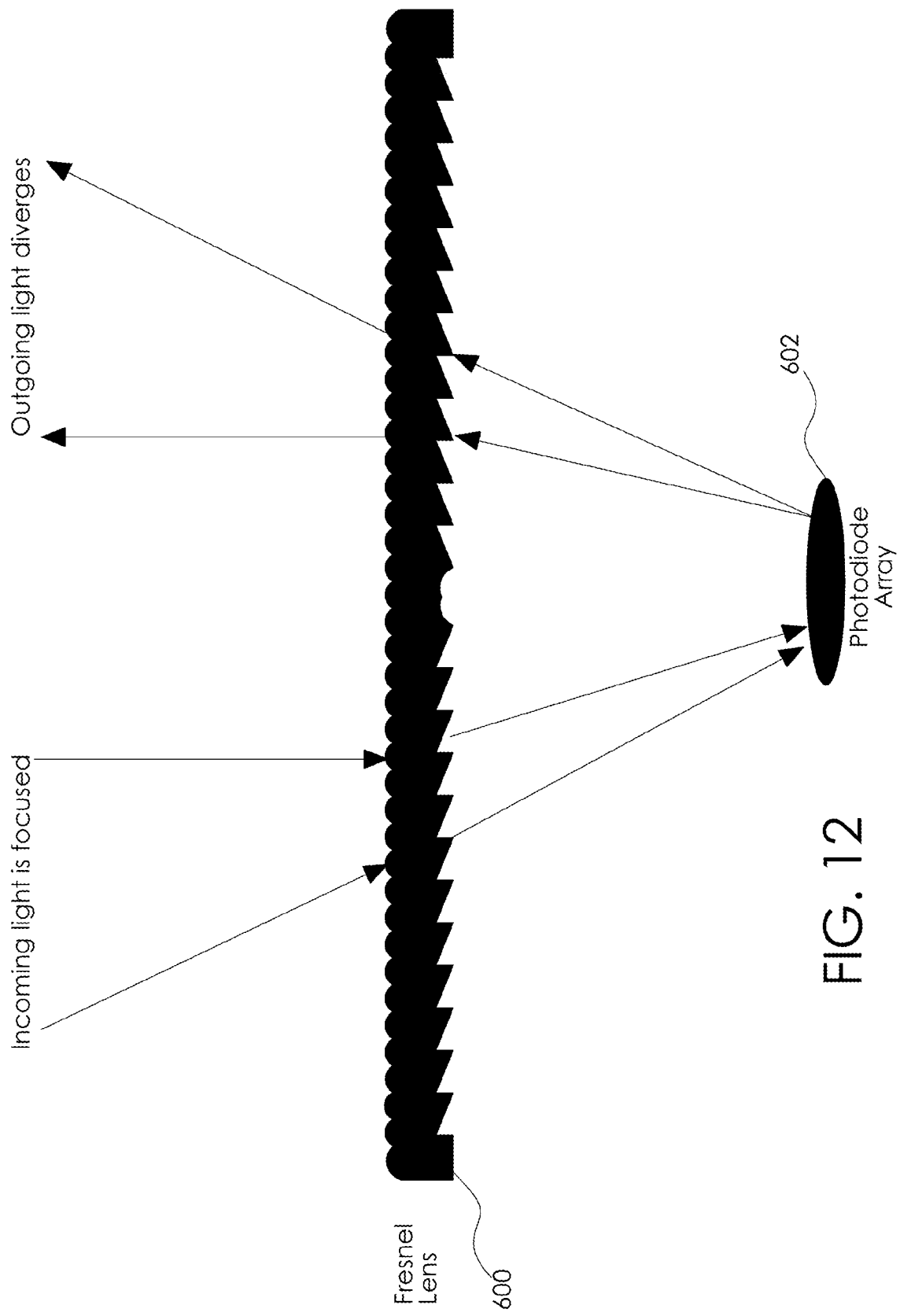
FIG. 12 is a cross-sectional illustration of light interaction between a Fresnel lens and a photodiode array in accordance with an embodiment.

As further illustrated by the lens stage of FIG. 13, the window used to seal off the inlet may also have dispersive properties near the outermost surface, to prevent back-reflections internal to the CPC 80 from being focused in the external environment, and focusing properties near the innermost surface, to aid in light collection at the outlet. Such properties can be achieved with an arrangement of Fresnel lenses 600, as further illustrated by FIG. 12, that will focus incoming light to the photodiode assembly 602 and diffuse radiation reflected within the CPC 80 and not captured by the photodiode assembly. More specifically, the Fresnel lens or other lens 600 may have a positive focal length for concentrating incident radiation at the inlet to the aperture on the outlet and the photodiode assembly 602. At the same time, the inner most surface of the Fresnel lens(es) may have a negative focal length for diffusing reflected radiation within the CPC 80 out to the CPC 80 over a larger area. Divergence of light out of the receiver inlet will further increase the laser safety of the entire system as the outgoing light has far larger irradiance. As shown in FIG. 13, the one or more Fresnel lenses 600 may be sandwiched between two primer layers 602 and 604, two thermally cured dip coats 606 and 608, two hard anti-reflective stacks 610 and 612, which the outside surface coated with a super oleophobic/hydrophobic top coat 614.

As will be further described below with reference to FIG. 4A and FIG. 4B, a CPC mirror 80 may be employed and sized to the enclosure in which the receiver 60 is located. The CPC mirror 80 may be used for pure light collection, to increase FOV light capture for the receiver 10, and for improved uniform illumination of the photodiode assembly 63. Internal surfaces of the mirror 80 may be coated with a thin layer of deposited metal in order to preserve, to the fullest extent possible, beam power. In an embodiment illustrated in FIG. 4B, the CPC mirror 80 may be truncated or extended at a shallow angle 81 toward the inlet in order to further increase the FOV of the system. The shallow angle or chamfered surface may also be extend 360 degrees around the CPC or less given preference of the application. A modular battery housing (not shown) may also be employed that includes a mechanical structure for housing a compact energy storage device 68 that could include but is not limited to a Li Ion or LiPo battery cell(s) or a bank of capacitors or supercapacitors, configurable and electrically connected to the full receiver device.

The receiver may be comprised of two major subsystems: the power receive subsystem and communication subsystem. Subsystem functionality may be designed to be modular with minimal interface requirements between them. The intent of a modular system design is to allow for a power only implementation or a communication only implementation, or both. In a modular design, interfaces (i.e., subsystem IO) that perform functional tasks based on input from the other may be reprogrammed to another host system or left open. The technical implication of this is the ability to incorporate just an FSOC subsystem or just a power receive chain into a plurality of upstream systems.

The receiver components may be designed with simplicity and a small form factor in mind. Incorporation of the receiver into consumer electronic applications may set the requirements for size, power usage, and power density, which can later be developed into a standard for such devices. The electrical circuitry may be kept as simple as possible in order to decrease board/device space and power consumption. The voltage converter 64 may play a role in decreasing device size. The boost converter 64 may be responsible for increasing the transducers output voltage to an appropriate battery charging voltage. Every converter stage may also require the use of power (as these are active switching components), which may serve to reduce the overall efficiency of the receiver 10. In order to decrease the efficiency loss to less than 8 percent at this stage, the boost converter 64 may use Maximum Multiple Power Point Tracking (MPPT), which is similarly implemented in solar cell systems, but which is not known to be used in IR laser-based systems, within the first converter stage. The MPPT architecture is a "test and adjust" type probing the required input impedance in order to maximize the power delivered from the photodiode assembly by ensuring matching circuit and device impedances.

An additional battery charger manager 66 may be employed to ensure the full charge cycle for a Lithium Ion, Lithium Polymer, or other battery chemistry is accommodated. If the battery or storage device of the host receiver is not Lithium based, the battery charger manager may be unnecessary. A bulk/storage capacitor 84 may also be used between the photodiode assembly 62 and the voltage converter 64 in order to provide the voltage converter 64 with filtered electrical power.

The design of the receiver 60 may also seek to keep leads as short as possible to minimize lead resistance and distributed inductance, i.e., for transient charging cycles. The voltage output of the photodiode assembly, an embodiment of an optical to electrical converter, may be sampled by the processor 70 and may be considered part of the safety subsystem. Sampled data may be stored and forwarded to encoder/decoder 77 to encode a bit sequence on a predefined carrier frequency to be transmitted by the FSOC LED 78.

One uniqueness of this architecture is that the receiver 60 sends simple bit streams to the transmitter 10, messages that require close to no message overhead. The processor of the transmitter 10 performs the heavy lifting in terms of interpreting the bit sequence.

Finally, the core logic on the receiver 60 may come from the processor 70. The processor 70 may interpret feedback from the IR transceiver 82 and encoder/decoder 77. The receiver 60 may also incorporate a communication system that is an improvement to the IrDA (Infrared Data Association) standard. As the IrDA standard is designed for operation between 1 cm and 1 meter, a greater range is needed to make the present disclosed technology more useful and distinctive. At the same time, ambient light sources may contaminate the sensor causing interference to small optical input signals. In order to overcome this issue in an embodiment, it may be desirable to increase the magnification of the IR FSOC light with a hemispherical lens on the photodiode receiver 76 and design a narrow bandpass filter on the photodiode receiver back end. The bandpass filter may only allow a certain band of wavelengths through while suppressing both DC ambient and sporadic external sources. Further distance increase may be gained from driving the FSOC LED at its maximum supply level while maintaining eye safety limits.

Figure 4B:
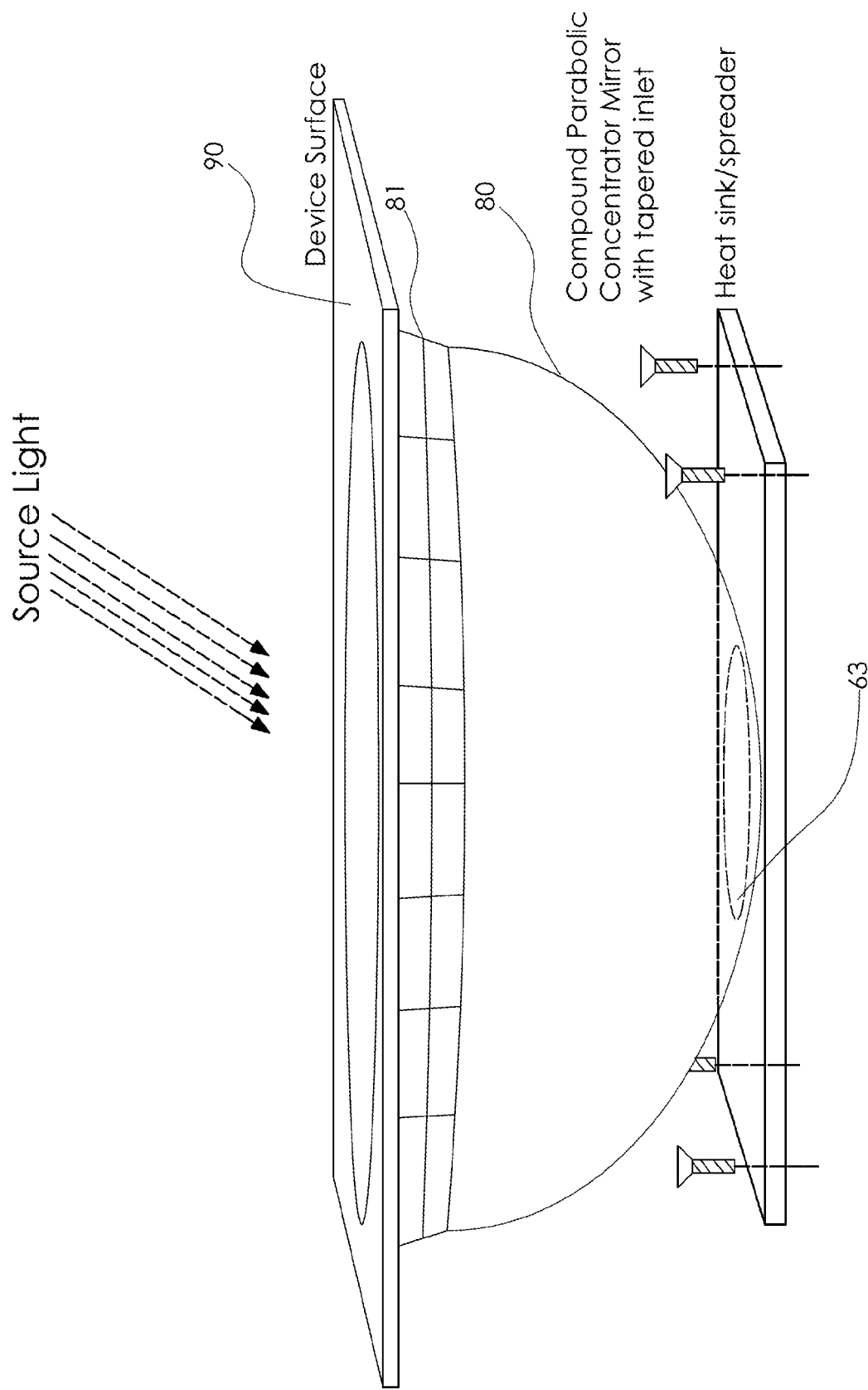
FIG. 4B is an illustration of a compound parabolic concentrator mirror with a tapered inlet of the receiver in accordance with another embodiment.

The optical architecture of the receiver 60 may be primarily comprised of a scratch resistant hydrophobic, and possibly oleophobic, antireflective (AR) coated optical window 90 as illustrated in FIG. 4A, FIG. 4B and FIG. 13 that interfaces with the receiver into which the receiver 60 is incorporated, known as a lens stack. The external optical interface with the receiver and ambient environment may be flush such that scratches or breakage that may occur with an off-set or raised surface (or domed surface) are avoided. The window itself may be AR coated exhibiting scratch resistance and hydrophobicity/oleophobicity. This may maintain a clean IR transmissive surface at the inlet of the CPC to ensure fidelity of the beam path to the receiver photodiode assembly while avoiding dirt, moisture and grime accumulation on the optical surface.

As previously noted, and further illustrated in FIG. 4A and FIG. 4B, a CPC mirror 80 may focus incoming light at its inlet onto the photodiode assembly 63 at its outlet. The optical to electrical converter may be coupled with the FSOC LED 78 and IR photodiode 76 of FIG. 3. The CPC mirror 80 may be uniquely shaped as a light collector and may materially increase the FOV of the overall system. One advantage of the CPC mirror is that it eliminates the need for a collecting lens to focus light on the photodiode. The internal walls of the CPC may be coated with 100-300 nm of silver or gold or aluminum depending on the embodiment with an environmental protection layer to increase part life. The point behind the coating may be to ensure maximum reflectance across the IR beaming wavelength range. Loss due to reflection or absorption at this interface may be <1%. The overall shape of the CPC mirror 80 may be based on the intersection of two parabolas and thus may have a cone or bowl like appearance. As shown in FIG. 4B, the CPC may be further truncated on the inlet side of the mirror in order to allow for tapering the edges 81 with connection to the OML or for allowing an increased system FOV.

The photodiode assembly 63 may be integrated into the base of the CPC mirror 80 to ensure maximum exposure to incident light. As noted, a NIR AR coating may be applied to the top window surface 90 flush with the external surface of the device. In order to withstand the stochastic user environment, there may be a need to maintain a hard coat on the top surface to decrease the probability of scratches that could degrade the surface and therefore the overall effectiveness of the system. In addition, fingerprints and other environmental contaminants are likely to be present during the lifetime of the part. The hydrophobic surface may help to ensure minimal surface contamination. The hydrophobicity layer may be implementable during production and during use through temporary and permanent coatings. A similar integration may be used for oleophobic coatings. Thus, users may "touch up" optical surfaces if desired, which may lead to increased performance. The IR LED 78 and IR PD 76 form the basis of the communication and safety subsystem of the receiver 60. As previously noted, the FSOC low power laser beam co-propagates with the high-power beam to form a virtual enclosure around the high-power beam. The FOV of the low power laser beam components may therefore need to be greater than or equal to the FOV of the high-power laser beam components in order to ensure that the high-power laser beam will remain contained within the light cone of FSOC low power laser beam and communication link with the transmitter 10 at all possible power beaming positions. In various embodiments, either active or passive lens or optical material may be added to the beam path of the low power laser beam in order to further converge or diverge the FSOC beam and ensure such coverage with respect to the power beam. The FSOC optoelectronic components may be located as close as possible to the power receiving photodiode assembly. These embodiments may include applications where there are further transmission range requirements.

The overall physical size of the integrated receiver may be designed to be compatible with the environment in which the receiver is used. For many mobile consumer electronics applications, this means the dimensions per side are in the 10 mm or less range. However, these dimensions are merely exemplary and the present disclosure is not limited to such dimensions. Nevertheless, maintaining a small volume may allow the technology to be integrated into a variety of hardware devices. The overall supporting structure (not shown) for the CPC mirror 80 may be centered on stabilizing the CPC/photodiode assembly. The CPC itself may be manufactured individually or cut from a cube made of optical material. Integration of the CPC with the photodiode may happen in conjunction with integration into the receiver or before.

Moving now to the photodiode assembly 63 of the receiver, reference is made to FIG. 5-FIG. 11. The photodiode assembly 63, may be a back-contact photodiode assembly designed specifically for high power laser optical to electrical transduction. As will be further described below with references to FIG. 9A and FIG. 9B, the back-contact photodiode assembly may be comprised of a plurality of photosensitive regions arranged in pie wedges to maximize photon exposure and decrease the component footprint, as well as to achieve uniform response from each photodiode in a pie wedge. The device band structure may be specifically designed to optimize a narrow wavelength absorption by manipulation of the composition of the $In_xGa_{1-x}As$ semiconductor material from which it may be formed. Namely, "x" is carefully chosen so that light may be efficiently (>95%) absorbed within 2-5 μm thickness, while the bandgap may be only slightly smaller than the photon energy to maximize the power conversion efficiency. The back-contacts, which may serve as both electrical and thermal pathways, may be sized for minimal series resistance, sufficient heat capacity, have a large surface area for heat dissipation, and for mass manufacturing. Each of these aspects are further described in detail below.

Figure 5:
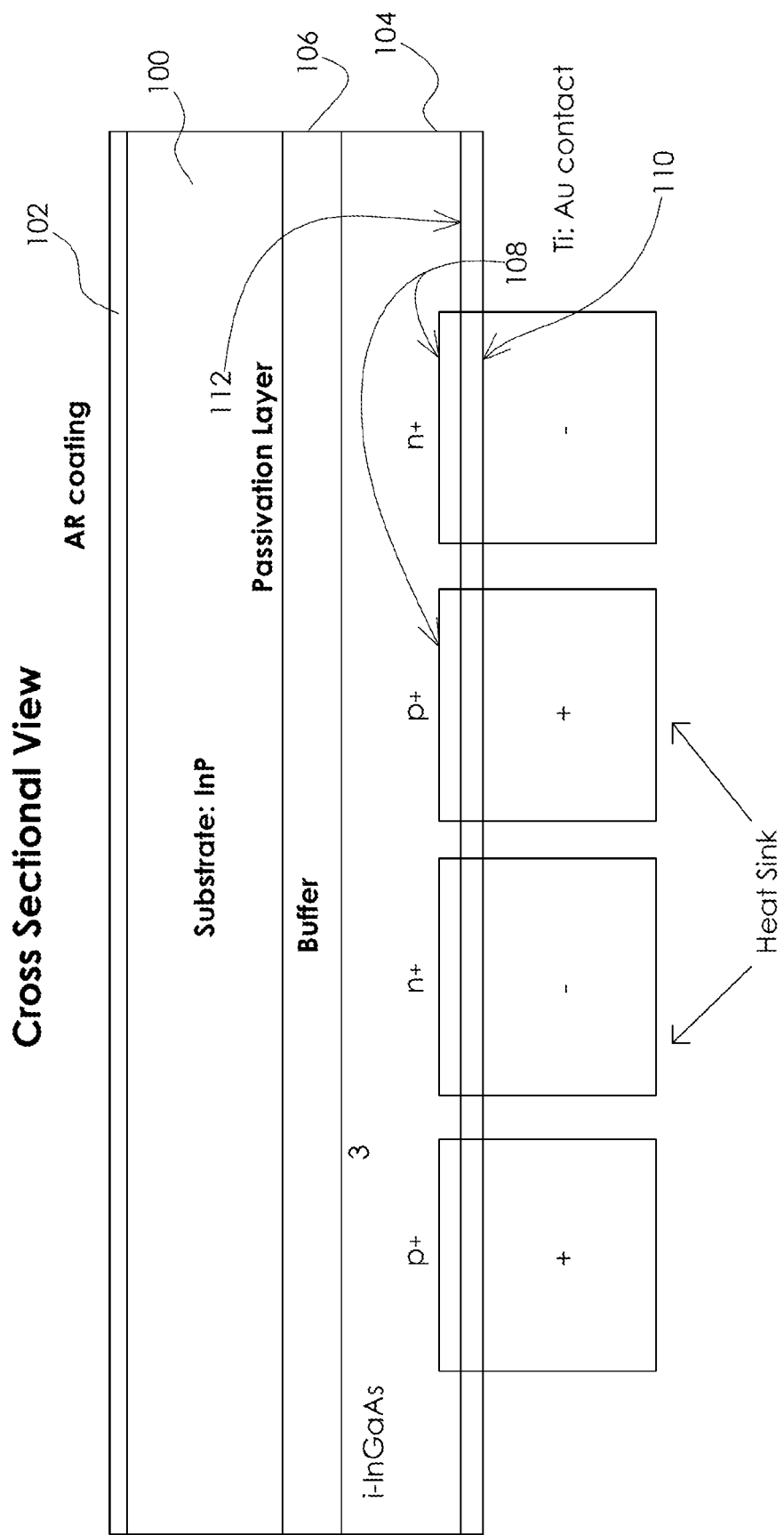
FIG. 5 is a cross-sectional view of the photodiode assembly of the receiver in accordance with an embodiment.
Figure 6:
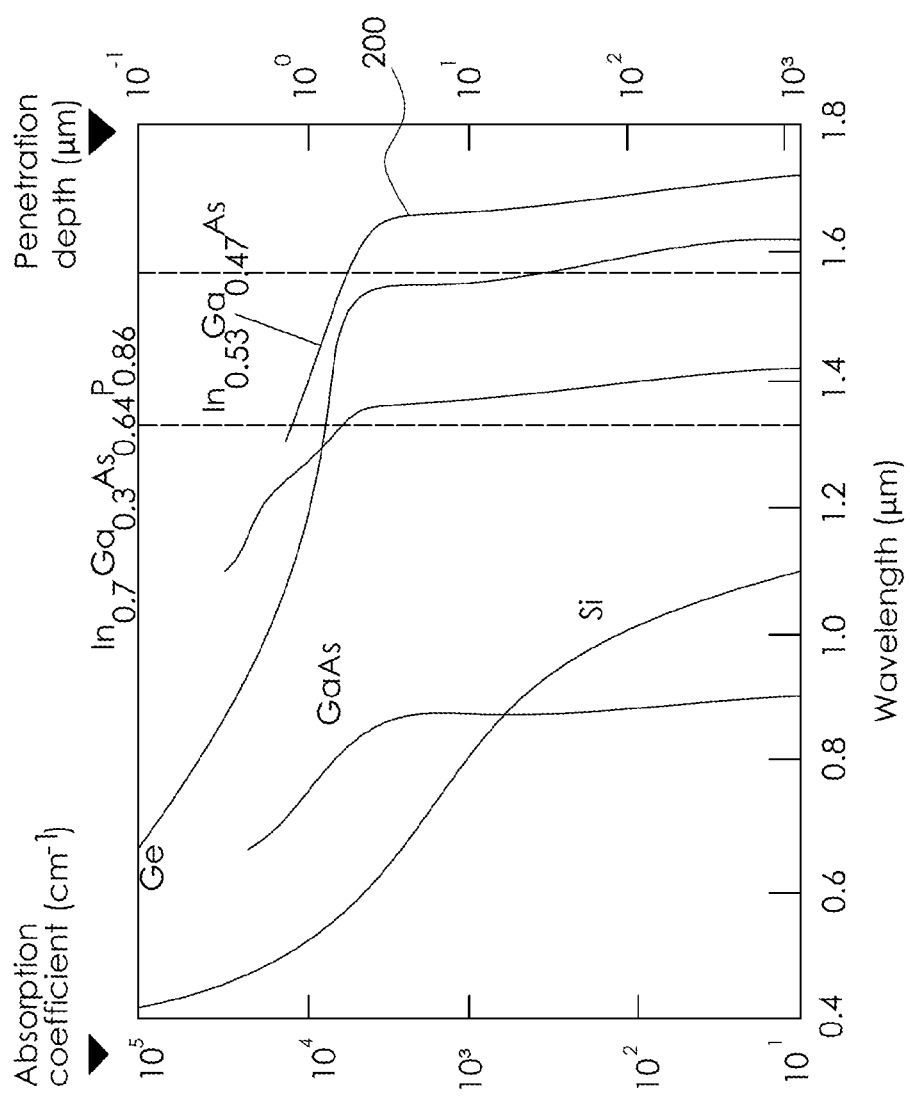
FIG. 6 illustrates the penetration depth of light as a function of its wavelength.
Figure 7:
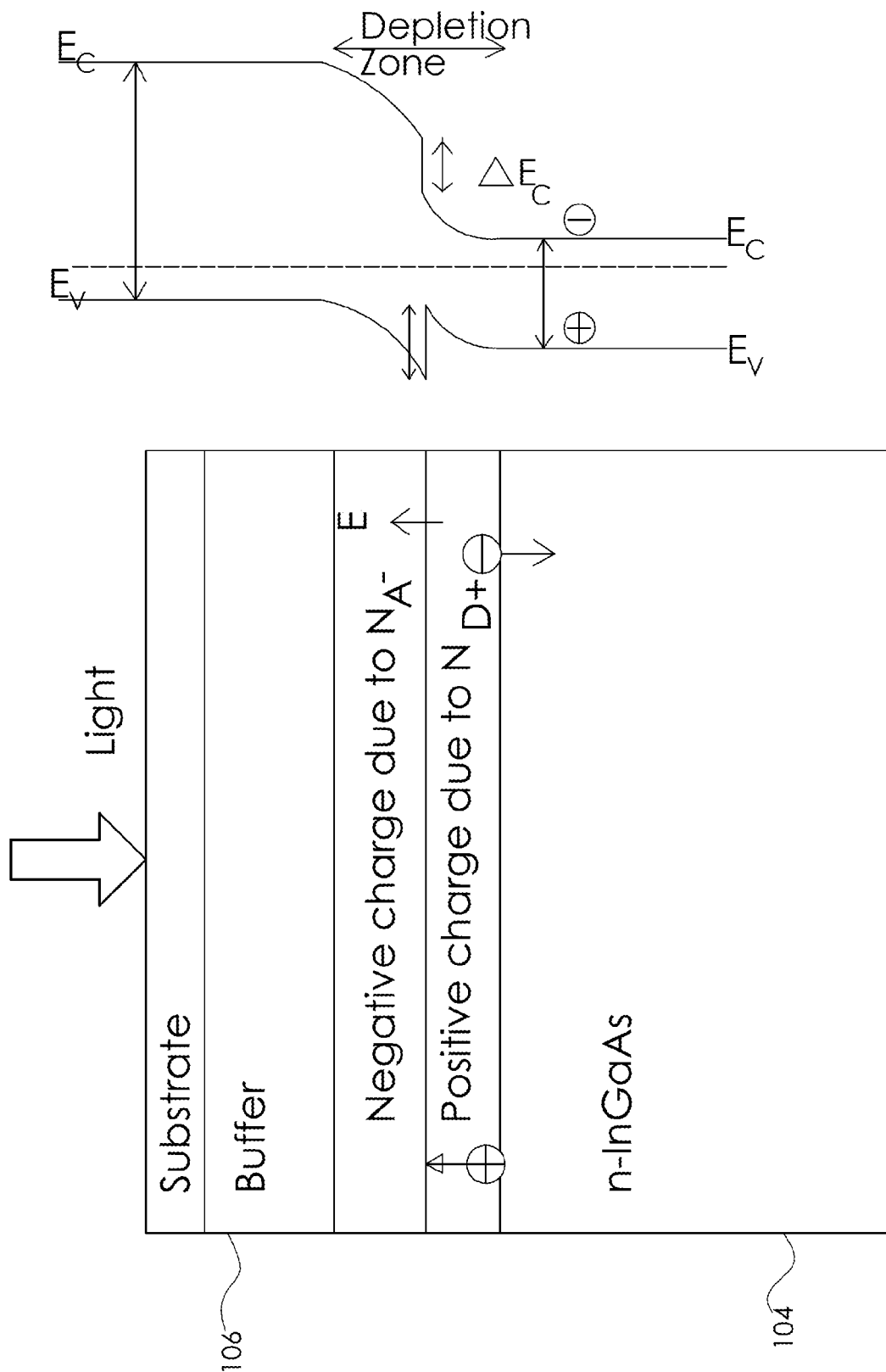
FIG. 7 is a cross-sectional view further illustrating a portion of the photodiode assembly of FIG. 5 to better illustrate the light absorption and electron conversion capabilities of the photodiode assembly in accordance with an embodiment.

As illustrated in FIG. 5, the top substrate surface 100, i.e., the surface upon which light is incident, may be an uninterrupted bulk, lightly doped InP substrate. In this context, lightly doped means concentrations of <10^16 atoms/cm^3 of impurities. In order to prevent incoming radiation from reflecting off the surface of the InP, the top substrate layer 100 may be coated with a thin anti reflection layer 102 with a thickness that matches a quarter wavelength of the intended incoming radiation. The anti-reflection (AR) layer 102 may be Si3N4 or another compound with a refractive index close to the square root of product of the refractive indices: $n_{air} \times n_{semiconductor}$. The substrate 100 and underlying layer(s) may be sized based on the absorption coefficient of 1400-1600 nm light in InP/InGaAs material. The penetration depth of light as a function of wavelength is further illustrated in FIG. 6. As illustrated by the plot, within the active InGaAs region 200 most of the light is completely absorbed within a few microns.

An additional consideration for the active region of the photodiode assembly 63 is the size of the depletion width, or the area in which photogenerated electrons and holes are diffused to n+ and p+ regions due to the electric field setup within this region. Inside this active region, the electric field may be very strong, such that electrons are separated to create the electron hole pairs. The corresponding energy required for the separation is known as the band gap energy. The band gap energy combined with knowledge of the wavelength of incident light may allow for optimization of the material atomic concentrations. Between the substrate layer 100 and the InGaAs layer 104 is a heterojunction buffer layer 106 that may prevent electrons and holes leaking back into the InP substrate layer 100, as further illustrated in FIG. 7. In other words, the heterojunction buffer 106 may implement unidirectional (only to the bottom n+/p+ electrode regions 108, not the top InP layer) photo carrier collection. This may be an ideal situation for producing efficient optical to electrical energy conversion.

Figure 8:
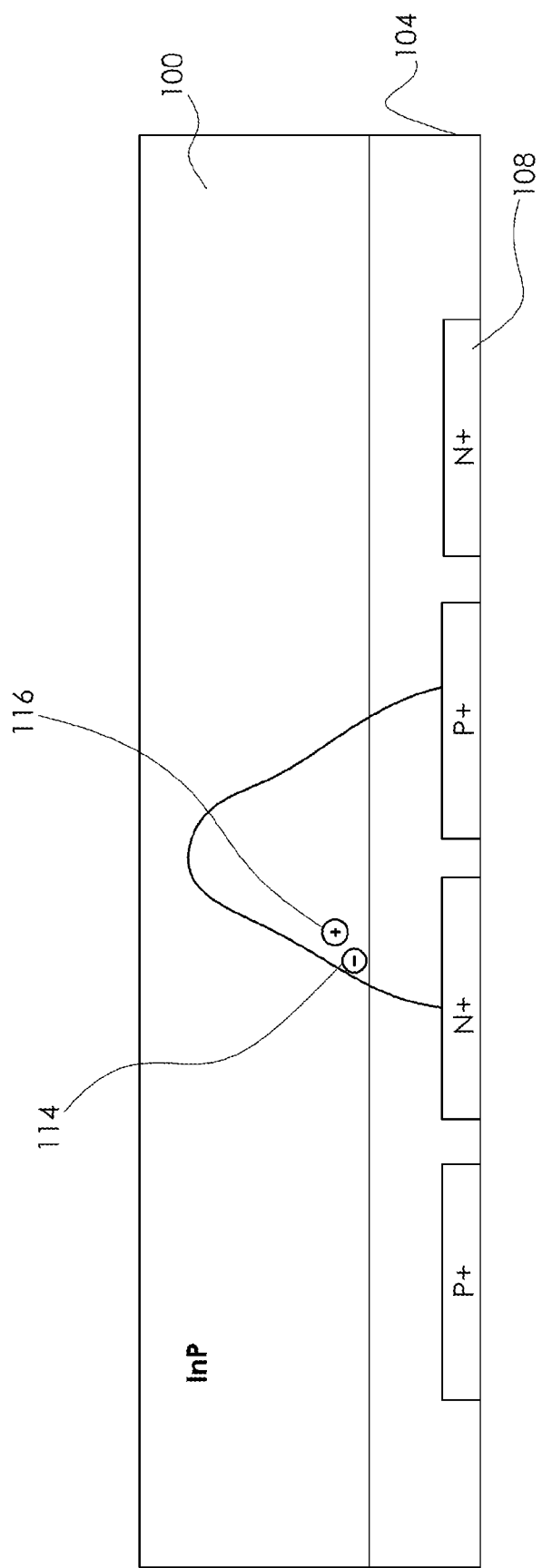
FIG. 8 is a cross-sectional view further illustrating the PIN structure of the photodiode assembly of FIG. 5 and the carrier transport mechanism in accordance with an embodiment.

As further illustrated in FIG. 8, electron hole pairs are generated within the active n+/p+ electrode regions 108 as a function of incident light. A PIN structure may therefore be formed via alternating n+/p+ electrode regions 108 with a small width between them and the electrode regions 108. The small separation distance may ensure liberated electrons 114 within the active region, are swept toward n+ regions and holes 116 within the active region are swept toward the p+ region, creating a steady stream of current. The n+ and p+ electrode regions 108 may be configured such that there is a conductive path to the interdigitated back-contacts 110. A thin passivation layer 112 between the back-contacts may prevent electrode regions from directly shorting. The passivation layer 112 may be made from a plurality of suitable materials (Cu, Al, Ag, etc.).

Figure 9A:
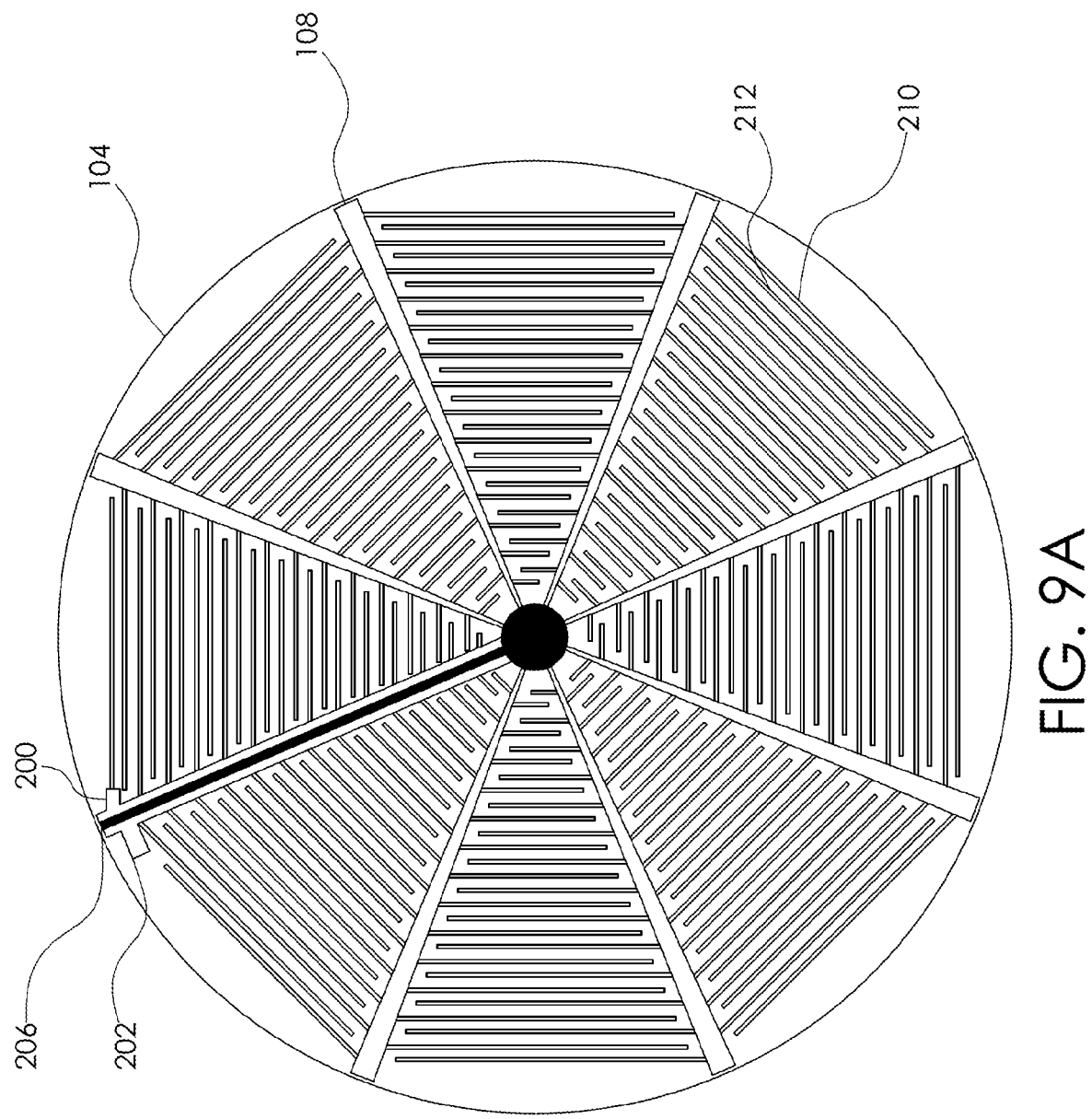
FIG. 9A illustrates a top view of the back-contact pattern of the photodiode assembly of FIG. 5 in accordance with an embodiment.
Figure 9B:
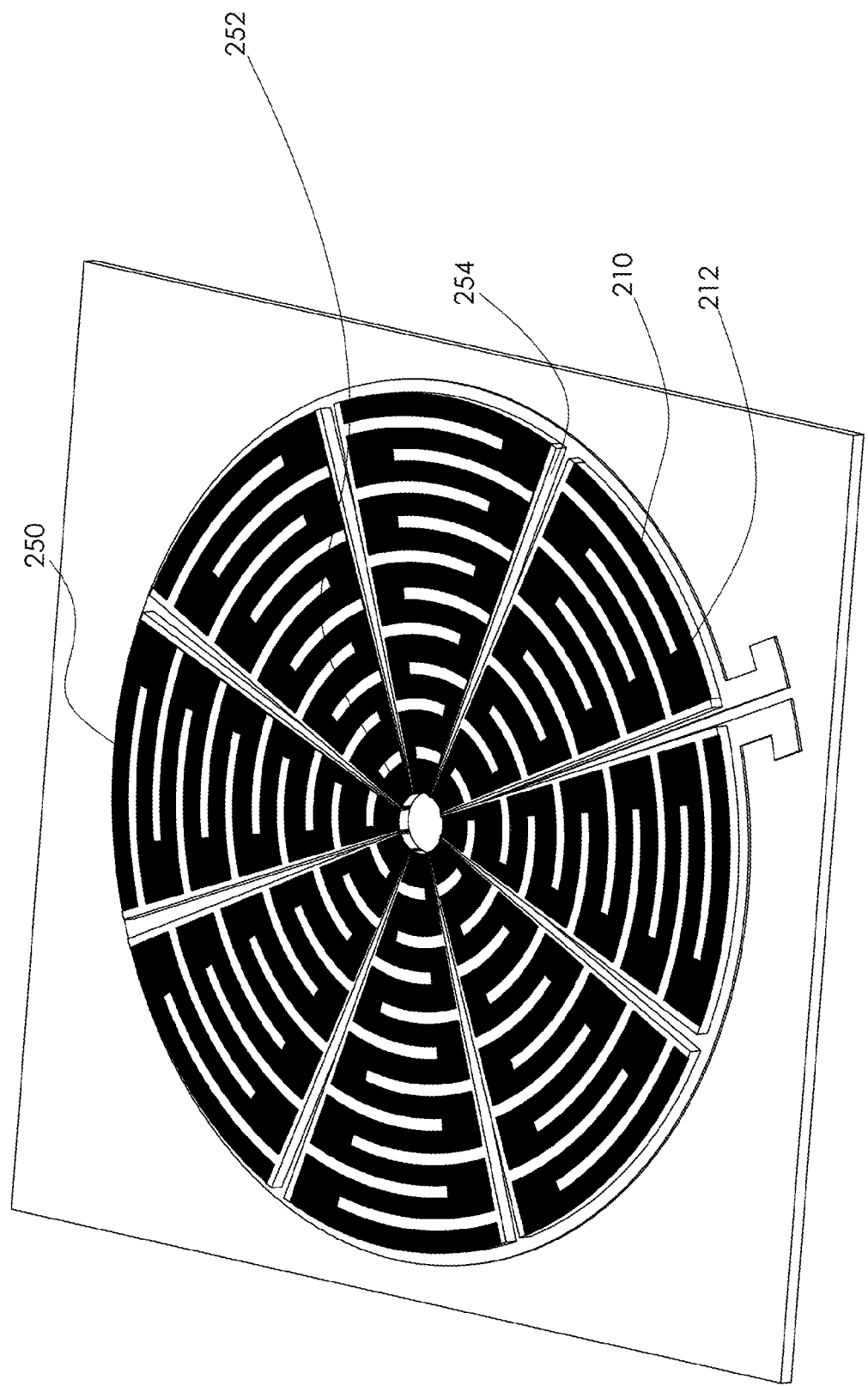
FIG. 9B illustrates a top view of the back-contact pattern of the photodiode assembly of FIG. 5 in accordance with another embodiment.

As previously noted, the back-contacts, each in the form of a finger-like structure, are interdigitated based on the spacing between the p+/n+ electrode regions 108. This may enhance collection efficiency by having a distributed periodic structure equally spaced on the backside of the photodiode assembly 63. The back-contacts may be fine structures formed into pie shaped sections in order to decrease series resistance. In one embodiment illustrated in FIG. 9A, the interdigitated fingers 210 and 212 are substantially straight. In a second embodiment illustrated in FIG. 9B, the interdigitated fingers 210 and 212 may be shaped to conform to the radius of curvature of the overall device. For example, as shown in FIG. 9B, each pie shaped section 250 has smaller, slightly curved interdigitated fingers towards a central area 252 and substantially longer interdigitated fingers towards an outer area 254 so as to conform the circular shape of the photodiode assembly 63. By shaping the p+/n+ regions, which are adjacent to the back-contact electrodes, to conform to the circular shape of the photodiode assembly 63 it may be possible to improve overall collection efficiency and power conversion efficiency.

The anode 200 is serially connected to the cathode 202 ccw (counter-clock wise) around the photodiode assembly 63. The serial connection may allow for threshold voltages generated by each of the individual sections to be additive, thereby producing an aggregate voltage at the device terminals. The sections of the assembly may additionally be monitored, as illustrated by monitoring points 400 of FIG. 11, and measured for output voltage so as to determine the relative illumination intensity of each section. This voltage information may be communicated to the transmitter to help refine beam pointing. The fine finger structures are positioned just below the p+/n+ electrode regions 108 where maximum collection of photogenerated electrons within the active region can occur. The interdigitated design may allow for fine placement of the electrode region fingers to setup a continuous field structure across the n+/p+ electrode regions 108. Finger length is minimized to decrease series resistance and periodic electrode rails provide low resistance connection from section to section. To prevent shorting of the fine finger structure, gap filling with a silicone polymer, h-BN, or similar electrically resistive material, the back surface may provide sufficient isolation 206. It should be noted that the top InP surface 100 does not need to be etched or separated into discrete sections like the back-contact pattern, as the present disclosure need not rely on the optoelectronic performance of the bulk substrate 100.

The photodiode assembly 63 of the present disclosure may be integrated in various forms. One such method, as further illustrated in FIG. 10, involves integration onto a PCB (printed circuit board) in which the anode and cathode are routed out of the device as traces. In this embodiment, the device may be used in a variety of forms, e.g., a receiver element used in a laser based wireless power transmission system providing power to co-located devices, a sensor used for applications involving high powered lasers, and as a fine tune or alignment sensor, when wired individually, based on individual section feedback or in a plurality of other optical based systems. Further integration into complex or stand-alone systems may also be possible based on the application.

Figure 10:
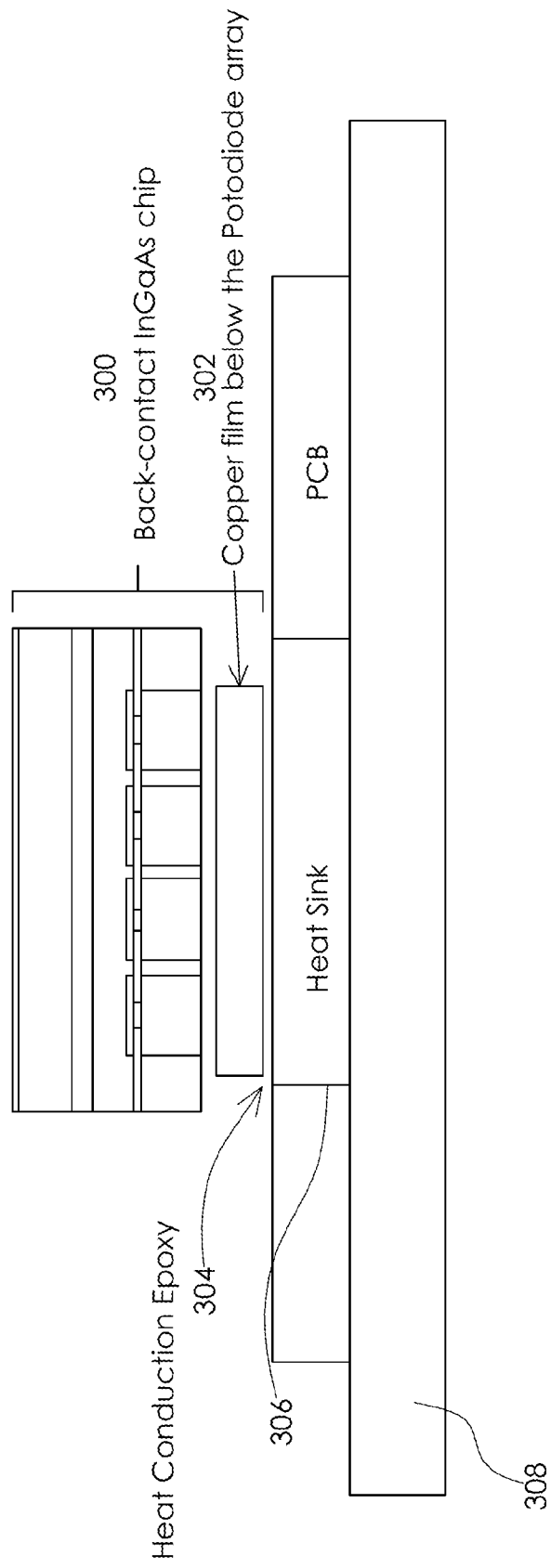
FIG. 10 illustrates a cross-sectional view of the photodiode assembly of FIG. 5 with the back-contact pattern illustrated in FIG. 9 integrated into a printed circuit board (PCB) configuration in accordance with an embodiment.
Figure 11:
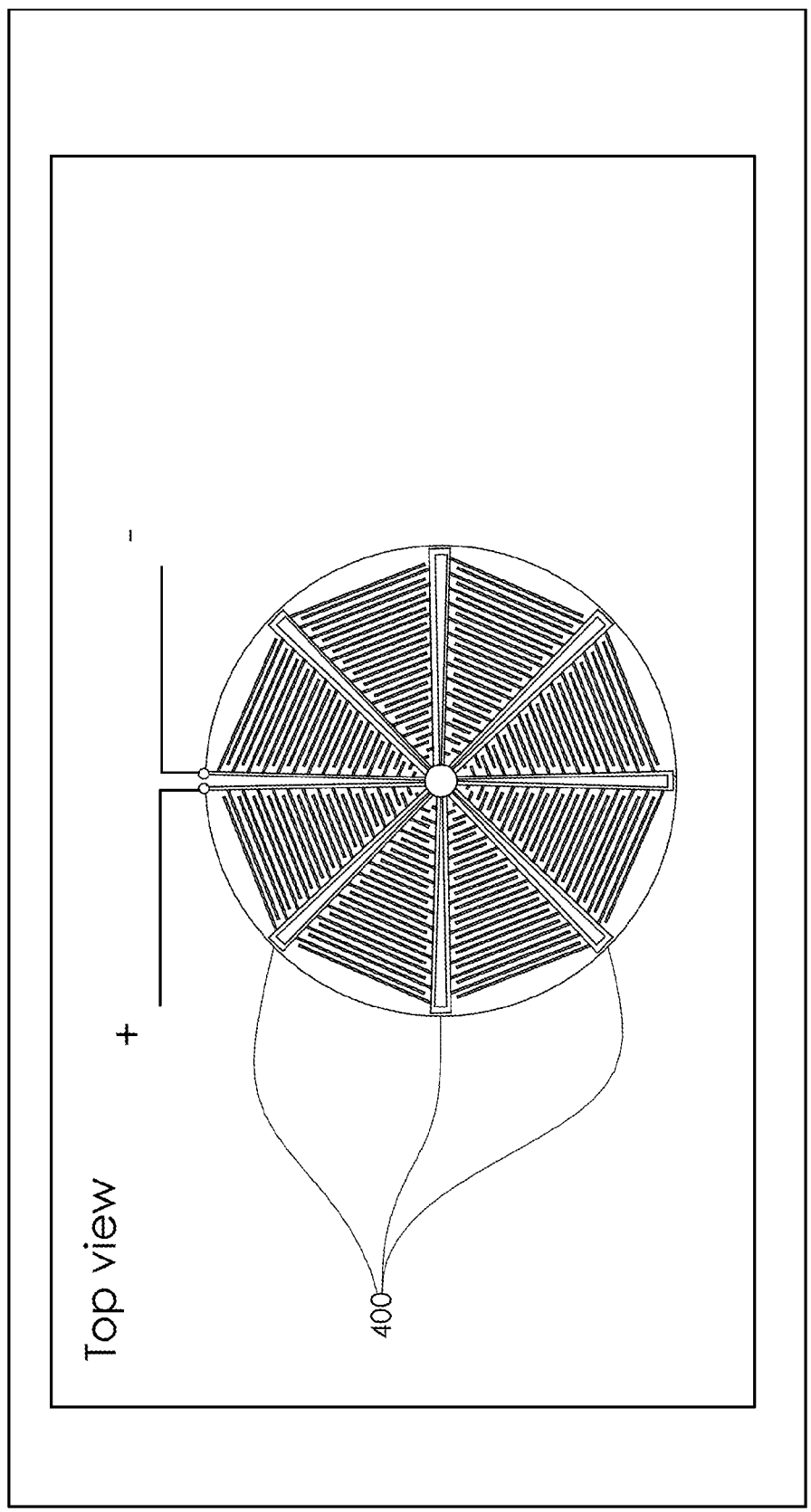
FIG. 11 is a top view of the PCB configuration of FIG. 10.

In FIG. 10 and FIG. 11, the InGaAs assembly/chip 300 may be bonded to a small section of copper film 302. The bond area may cover the entire back of the photodiode assembly/chip 300 and as such a small electrically isolating layer (not shown) may applied between the copper film and the back-electrode contacts. The copper film 302 may bonded by a heat conduction epoxy layer 304 onto a heat sink 306 and/or a blank copper pour 308 (the thickness of which may vary) on the PCB. The anode electrode may exit the side of the chip and be attached either directly to the PCB via traces or wiring. The disclosed device may therefore maintain a compact form factor for increased modularity and ease of component integration via electrode pads. The disclosed device may also allow for wiring in parallel depending on the requirements of the load and the expectation of inputs to downstream circuitry.

The overall operation of the power transfer device may be described as follows. The receiver may recognize its State of Charge ("SOC"), or source voltage, or a plurality of other indicators, are lower than a predefined threshold and ping, or wake up, the embedded wireless power transfer hardware. An IR LED on the front face of the receiver may then begin emitting light periodically as a "beacon signal" to any nearby transmitter. The beacon signal may be a FSOC signal comprised of a short digital data stream modulated on top of a carrier signal containing a device unique ID (device name, make, revision, type, etc.), a state of charge (SOC) indication, and information for the transmitter to generate the lock ID. The lock ID is generated within the transmitter as a position-based record (in coordinates relative to the beam steering subassembly) of the last known location of the receiver as confirmed by the receiver over the FSOC link. In another embodiment, the receiver may use a built in RF antenna to communicate state information to a nearby transmitter. The transmitter may use a built in RF antenna to check receiver SOC, battery voltage or the like and to determine ability of the receiver to participate in wireless power beaming processes. In an embodiment, the transmitter may choose not to engage the receiver in the wireless power beaming process if transmitter determines that the receiver's remaining battery charge is too low for it to be beneficial. The transmitter may also decide against engagement with a specific receiver if the device priorities have been set in such a manner that: 1) other, more critical, units require power beyond what the transmitter is able to provide to the requesting device; 2) the transmitted device ID is determined to not be serviceable by the targeted transmitter (e.g., the device firmware or hardware is out of date or unlicensed); or 3) there is a recognized error state set in the receiver. The transmitter may then release the connection to the receiver, such that other receiver functions can take priority.

Meanwhile, the transmitter may monitor its IR photodiode for a beacon signal and processes the receiver digital information once its photodiode is activated by the beacon signal. As the beacon signal is detected, the transmitter IR camera may switch from an "idle" state to an "active" state and begins to localize the IR beacon from the receiver. The IR camera may change state, i.e., from active to idle, only after a predetermined "no detect" period has passed, which may be approximately 30 seconds (the time period, i.e., more or less time, does not change the method of this embodiment) after the transmitter's IR photodiode last detected a signal.

After the transmitter IR camera has identified the approximate location of the beacon signal, a continuous communication link via FSOC may be established. The transmitter IR low power laser diode may begin to execute a localized scan pattern in the vicinity of the approximate location of the identified receiver. Once that scan is caught by the receiver photodiode, the communication link/handshake may be established. The predetermined period for establishing the link may be called the "handshake event time". As described above, the low-power transmitter IR beam is coincident with the high-power beam of the transmitter. The transmitter's low power laser beam produces a larger spot size at the receiver's beacon photodiode than does the transmitter's high-power beam at the receiver's power beaming photodiode.

Once the handshake event has occurred, the transmitter high power laser beam, in a low power setting, may then sweep across the area localized by the transmitter's low-power laser diode in order to locate the power beaming photodiode of the receiver. The low power laser diode may modify the output spot based on state. This includes through electrically activated optics, which may be a liquid lens. The receiver LED may report back power data to the transmitter in microsecond intervals over the established communication channel. Once the transmitter IR power beam has swept back across the local maxima, as reported by the receiver IR LED, localization may be considered completed and the high-power beam supply may be increased to suit the type of device. The low-power laser beam may maintain continuous communication with the transmitter photodiode to deliver information on transfer efficiency, received power, SOC, and current and voltage readings from the power photodiode.

Any loss of reported information lasting longer than the predetermined safety shut off time may cause an internally generated hazard-warning signal to the transmitter laser driver to decrease the beam power to safe levels. Any end of beam activities may be directly signaled by the receiver IR LED (either through lack of data or specific bit sequences) and interpreted by the transmitter IR photodiode. The duration of any end of beam activities signal may not last more than the predetermined safety shutoff time.

In the event of an end of beam activity, for example, if the link margin efficiency or voltage/current statistics from the receiver power photodiode assembly is violated, the transmitter may attempt to re-localize the receiver power photodiode, starting with the last known location of the receiver, the aforementioned lock ID which is stored by the transmitter in case tracking is required. The same transmitter scan pattern described above may be engaged with the receiver IR LED reporting back incident power.

If either the transmitter or the receiver electronics determine an internal condition (vs. an external LOS interruption) that would inhibit nominal operation, the transmitter/receiver will communicate that to the receiver/transmitter and enter a fail-safe mode. No further communication or power transfer may occur until the fault is cleared. Faults will be classified per category: internally resettable, externally resettable, User Equipment, "UE", replacement, etc. An indication of either the transmitter or the receiver being in a fail-safe mode may be indicated visually with a blinking LED on the transmitter and an error message on the UE. While the presently described operational methods are described in the context of the particularly disclosed power transfer system set forth herein, the operation methods are not limited to just the described device and could be implemented with different types of power transfer devices in accordance with the present disclosure.

In an embodiment, a transmitter of a wireless power transfer and data communication system comprises a transmitter system including a communication system that comprises a transmitter housing; one or more high-power laser sources, each high-power laser source configured to generate a high-power laser beam to a corresponding high-power receiver among one or more high-power light receivers inside a receiver housing of a remote receiver system; a laser controller configured to individually control operation of each high-power laser source; one or more low-power laser sources, each low-power laser source configured to generate one or more low-power laser beams to a corresponding low-power light transceiver system among one or more low-power light transceiver systems in the receiver housing, the one or more low-power laser beams including first optical communication for the corresponding low-power transceiver system; one or more photodiodes configured to receive second optical communication from each corresponding low-power light transceiver system; a beam steering system and lens assembly configured to direct each high-power laser beam to the corresponding high-power light receiver and to direct each low-power laser beam to the corresponding low-power light transceiver system, wherein a first low-power laser beam for a first low-power light transceiver system is co-propagated with a first high-power laser beam for a first high-power light receiver so that the first low-power laser beam is in close proximity to the first high-power laser beam substantially along an entire distance between the transmitter housing and the receiver housing; and a safety system configured to instruct the laser controller to reduce the one or more high-power laser sources in response to one or more detected events.

In the embodiment, the beam steering system is an optomechanical system including a plurality of motors and a plurality of optics configured to project light over a wide cone of coverage extending from the transmitter housing to the receiver housing.

In the embodiment, the one or more detected events include one or more of: (a) the one or more low-power laser beams being impinged partially or completely by an object over any portion of the entire distance, (b) occurrence of a fault, (c) the second optical communication being disrupted for longer than a threshold period, and (d) the second optical communication including unexpected information. In the embodiment, the unexpected information includes one or more of: (a) second optical communication including optical serial data signals consistent with off-nominal performance, (b) interference due to ambient lighting or severe reflections, and (c) second optical communication representing state changes at the receiver.

In the embodiment, the first low-power laser beam surrounds the first high-power laser beam for substantially the entire distance.

In the embodiment, further comprising a main processor configured to provide high-level control over the one or more high-power laser sources, the laser controller, the one or more low-power laser sources and the safety system, further comprising a secondary microcontroller configured to provide primary control of the beam steering system, and wherein the safety system is further configured to require input from the main processor and the secondary processor in order to perform one or more of: (a) providing power to the one or more high-power laser sources, and (b) allowing the one or more high-power laser sources to reach optimal power beaming levels. In the embodiment, the input includes one or more of an optical signal and an electrical signal generated from within the transmitter housing.

In the embodiment, the one or more low-power laser sources include one or more of a laser diode and a LED operating at an optical output level within class 1 laser MPE/AEL limits.

In the embodiment, reducing the one or more high-power laser sources includes reducing one or more output levels below class 1 laser MPE/AEL levels and shifting the one or more high-power laser sources to a complete off state. In the embodiment, reducing the one or more high-power laser sources occurs within latency requirements derived from regulatory energy limits. In the embodiment, the safety system is further configured to instruct the laser controller to reduce the one or more high-power laser sources in the event of one or more of: (a) a temperature reading associated with the one or more high-power laser sources that is off nominal or outside of expected limits, and (b) a current sensor reading associated with the one or more high-power laser sources that is off nominal or outside of expected limits.

In the embodiment, the one or more high-power laser sources operate in either a continuous wave mode or in a pulsed mode.

In the embodiment, the high-power laser beam has a first wavelength, wherein the low-power laser beams have a second wavelength, and wherein the first wavelength is configured to be sufficiently different from the second wavelength so as to prevent the corresponding low-power transceiver system from being one or more of: (a) saturated by the high-power laser beam, or (b) incapable of receiving at least some the first optical communication.

In the embodiment, the low-power laser beams are shaped to form a first spatial profile and the high-power laser beams are shaped to form a second spatial profile, and wherein the first spatial profile is spatially different than the second spatial profile.

In the embodiment, the transmitter system is partially or fully integrated into an existing type of ceiling or wall mounted device. In the embodiment, the existing type of ceiling or wall mounted device includes one or more of lighting fixtures, a smoke alarm, a security alarm, a wireless information system, an emergency services system, and a CO2 alarm.

In the embodiment, the transmitter system further comprising a camera and one or more optical sensors, wherein the camera and the one or more optical sensors are configured to identify and track a transparent object between the transmitter system and the receiver and to prevent the one or more high-power laser sources from transmitting the high-power laser beam when the transparent object blocks a path between the transmitter system and the receiver.

In the embodiment, the transmitter system further comprising a wireless information connection configured to transmit diagnostic information about operation of one or more of the transmitter system and the receiver to a remote computing system.

In the embodiment, the transmitter system includes a visual indicator mounted in or adjacent to the transmitter housing and configured to convey information to a user about a state of one or more of the transmitter system and the receiver.

In the embodiment, a first state represents that the transmitter system and the receiver are engaged in wireless power transfer, wherein a second state represents a partial or full blockage between the transmitter system and the receiver, a third state represents that the transmitter system is trying to find the receiver, and a fourth state represents that the transmitter system and the receiver are not synced.

In the embodiment, the first optical communication and the second optical communication are modulated by one or more intensity modulated/direct detection (IM/DD) techniques.

Having thus described the different embodiments of a wireless power transfer system and methods of operating the same, it should be apparent to those skilled in the art that certain advantages of the described methods and apparatuses have been achieved. In particular, it should be appreciated by those skilled in the art that the wireless power transfer and data communication system may be implemented using different types of hardware, software and combinations thereof described herein and operated in a variety of different manners than that described. It should also be appreciated that various modifications, adaptations, and alternative embodiments thereof may be made within the scope and spirit of the present disclosure.

What is claimed:
1. A transmitter of a wireless power transfer and data communication system, comprising:
 a transmitter system including a communication system, comprising:
  a transmitter housing;

one or more first laser sources, each first laser source configured to generate a first laser beam to a corresponding first receiver among one or more first light receivers inside a receiver housing of a remote receiver system;

a laser controller configured to individually control operation of each first laser source;

one or more second laser sources, each second laser source configured to generate one or more second laser beams to a corresponding second light transceiver system among one or more second light transceiver systems in the receiver housing, the one or more second laser beams including first optical communication for receipt by the corresponding second light transceiver system, wherein the first laser sources are more powerful than the second laser sources;

one or more photodiodes configured to receive second optical communication from each corresponding second light transceiver system;

a beam steering system and lens assembly configured to direct each first laser beam to the corresponding first light receiver and to direct each second laser beam to the corresponding second light transceiver system, wherein a second laser beam among the one or more second laser beams for the corresponding second light transceiver system is co-propagated with a first laser beam for the corresponding first light receiver so that the second laser beam is adjacent to the first laser beam substantially along an entire distance between the transmitter housing and the receiver housing; and a safety system configured to instruct the laser controller to reduce the one or more first laser sources in response to one or more detected events.

2. The transmitter as recited in claim 1, wherein the beam steering system is an optomechanical system including a plurality of motors and a plurality of optics configured to project light over a cone of coverage extending from the transmitter housing to the receiver housing.

3. The transmitter as recited in claim 1, wherein the one or more detected events include one or more of: (a) the one or more second laser beams being impinged partially or completely by an object over any portion of the entire distance, (b) occurrence of a fault, (c) the second optical communication being disrupted for longer than a threshold period, and (d) the second optical communication including unexpected information.

4. The transmitter as recited in claim 3, wherein the unexpected information includes one or more of: (a) the second optical communication including optical serial data signals consistent performance of the transmitter system, (b) interference due to ambient lighting or reflections, and (c) the second optical communication representing state changes at the remote receiver system.

5. The transmitter as recited in claim 1, wherein the second laser beam surrounds the first laser beam for substantially the entire distance.

6. The transmitter as recited in claim 1, further comprising a main processor configured to provide control over the one or more first laser sources, the laser controller, the one or more second laser sources and the safety system, further comprising a secondary microcontroller configured to provide primary control of the beam steering system, and wherein the safety system is further configured to require input from the main processor and the secondary processor in order to perform one or more of: (a) providing power to the one or more first laser sources, and (b) allowing the one or more first laser sources to reach predetermined power beaming levels.

7. The transmitter as recited in claim 6, wherein the input includes one or more of an optical signal and an electrical signal generated from within the transmitter housing.

8. The transmitter as recited in claim 1, wherein the one or more second laser sources include one or more of a laser diode and a LED operating at an optical output level within class 1 laser MPE/AEL limits.

9. The transmitter as recited in claim 1, wherein reducing the one or more first laser sources includes reducing one or more output levels below class 1 laser MPE/AEL levels and shifting the one or more first laser sources to a complete off state.

10. The transmitter as recited in claim 9, wherein reducing the one or more first laser sources occurs within latency requirements derived from regulatory energy limits.

11. The transmitter as recited in claim 9, wherein the safety system is further configured to instruct the laser controller to reduce the one or more first laser sources in the event of one or more of: (a) a temperature reading associated with the one or more first laser sources that is outside of expected limits, and (b) a current sensor reading associated with the one or more first laser sources that is outside of expected limits.

12. The transmitter as recited in claim 1, wherein the one or more first laser sources operate in either a continuous wave mode or in a pulsed mode.

13. The transmitter as recited in claim 1, wherein the first laser beam has a first wavelength, wherein the second laser beams have a second wavelength, and wherein the first wavelength is configured to be sufficiently different from the second wavelength so as to prevent the corresponding second transceiver system from being one or more of: (a) saturated by the first laser beam, or (b) incapable of receiving at least some the first optical communication.

14. The transmitter as recited in claim 1, wherein the second laser beams are shaped to form a first spatial profile and the first laser beams are shaped to form a second spatial profile, and wherein the first spatial profile is spatially different than the second spatial profile.

15. The transmitter as recited in claim 1, wherein the transmitter system is partially or fully integrated into an existing type of ceiling or wall mounted device.

16. The transmitter as recited in claim 15, wherein the existing type of ceiling or wall mounted device includes one or more of lighting fixtures, a smoke alarm, a security alarm, a wireless information system, an emergency services system, and a CO2 alarm.

17. The transmitter as recited in claim 1, the transmitter system further comprising a camera and one or more optical sensors, wherein the camera and the one or more optical sensors are configured to identify and track a transparent object between the transmitter system and the remote receiver system and to prevent the one or more first laser sources from transmitting the first laser beam when the transparent object blocks a path between the transmitter system and the remote receiver system.

18. The transmitter as recited in claim 1, the transmitter system further comprising a wireless information connection configured to transmit diagnostic information about operation of one or more of the transmitter system and the remote receiver system to a remote computing system.

19. The transmitter as recited in claim 1, wherein the transmitter system includes a visual indicator mounted in or adjacent to the transmitter housing and configured to convey information to a user about a state of one or more of the transmitter system and the remote receiver system.

20. The transmitter as recited in claim 1, wherein a first state represents that the transmitter system and the remote receiver system are engaged in wireless power transfer, wherein a second state represents a partial or full blockage between the transmitter system and the remote receiver system, a third state represents that the transmitter system is trying to find the remote receiver system, and a fourth state represents that the transmitter system and the remote receiver system are not synced.

21. The transmitter as recited in claim 1, wherein the first optical communication and the second optical communication are modulated by one or more intensity modulated/direct detection (IM/DD) techniques.

* * * * *